US011359113B2

(12) United States Patent
Kamimura

(10) Patent No.: US 11,359,113 B2
(45) Date of Patent: Jun. 14, 2022

(54) POLISHING LIQUID AND CHEMICAL MECHANICAL POLISHING METHOD

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/939,227

(22) Filed: Jul. 27, 2020

(65) Prior Publication Data

US 2020/0354610 A1 Nov. 12, 2020

Related U.S. Application Data

(63) Continuation of application No. PCT/JP2019/008082, filed on Mar. 1, 2019.

(30) Foreign Application Priority Data

Mar. 27, 2018 (JP) ............................ JP2018-060516

(51) Int. Cl.

| | |
|---|---|
| ***C09G 1/02*** | (2006.01) |
| ***B24B 37/04*** | (2012.01) |
| ***C09K 3/14*** | (2006.01) |
| ***H01L 21/3105*** | (2006.01) |
| ***H01L 21/321*** | (2006.01) |

(52) U.S. Cl.

CPC .............. *C09G 1/02* (2013.01); *B24B 37/042* (2013.01); *C09K 3/1409* (2013.01); *H01L 21/31053* (2013.01); *H01L 21/3212* (2013.01)

(58) Field of Classification Search

CPC ......... C09G 1/02; B24B 37/042; B24B 37/00; C09K 3/1409; C09K 3/1463; C09K 3/1454; C09K 3/1436; H01L 21/31053; H01L 21/3212; H01L 21/304

USPC ............................ 438/691–693; 51/307–309

See application file for complete search history.

(56) References Cited

U.S. PATENT DOCUMENTS

2006/0099814 A1 5/2006 Carter et al.
2009/0181539 A1* 7/2009 Kon ...................... B24B 37/044 438/693
2010/0081281 A1 4/2010 Babu et al.
2015/0024595 A1* 1/2015 Dinega ................ C09K 3/1463 438/693
2017/0152421 A1* 6/2017 Ohtake .................... B01J 37/06

FOREIGN PATENT DOCUMENTS

JP 2008-519466 A 6/2008
JP 2012-503880 A 2/2012
JP 2015-224276 A 12/2015
JP 2016-531429 A 10/2016
JP 2017-202967 A 11/2017

OTHER PUBLICATIONS

Translation of JP2015224276A (Year: 2015).*
International Search Report dated Jun. 4, 2019, issued by the International Searching Authority in application No. PCT/JP2019/008082.
Written Opinion dated Jun. 4, 2019, issued by the International Searching Authority in application No. PCT/JP2019/008082.
International Preliminary Report on Patentability dated Sep. 29, 2020, issued by the International Bureau in application No. PCT/JP2019/008082.
Office Action dated Sep. 21, 2021, from the Japanese Patent Office in Japanese application No. 2020-510496.
Office Action dated Apr. 19, 2022 from the Japanese Patent Office in JP Application No. 2020-510496.

* cited by examiner

*Primary Examiner* — Duy Vu N Deo
(74) *Attorney, Agent, or Firm* — Sughrue Mion, PLLC

(57) ABSTRACT

A polishing liquid, which is used for chemical mechanical polishing, includes ceria particles having an average aspect ratio of 1.5 or more; and an anionic polymer or a cationic polymer, in which a pH of the polishing liquid is 3 to 8. In a case where the polishing liquid contains the anionic polymer, the polishing liquid further includes an inorganic acid or an organic acid including at least one group selected from the group consisting of a carboxylic acid group, a phosphoric acid group, a phosphonic acid group, and a sulfonic acid group.

33 Claims, No Drawings

POLISHING LIQUID AND CHEMICAL MECHANICAL POLISHING METHOD

CROSS-REFERENCE TO RELATED APPLICATIONS

This application is a Continuation of PCT International Application No. PCT/JP2019/008082 filed on Mar. 1, 2019, which claims priority under 35 U.S.C § 119(a) to Japanese Patent Application No. 2018-060516 filed on Mar. 27, 2018. Each of the above application(s) is hereby expressly incorporated by reference, in its entirety, into the present application.

BACKGROUND OF THE INVENTION

1. Field of the Invention

The present invention relates to a polishing liquid and a chemical mechanical polishing method.

2. Description of the Related Art

In manufacturing a semiconductor integrated circuit (large-scale integrated circuit: LSI), a chemical mechanical polishing (CMP) method is used for flattening a bare wafer, flattening an interlayer insulating film, forming a metal plug, forming an embedded wiring, and the like.

Among processes of such LSI manufacturing, use of CMP is expected to increase in Front End of Line (FEOL), which is a pre-process of manufacturing semiconductor integrated circuits. In FEOL, materials forming a film that is a target of CMP are mainly silicon nitride, silicon oxide, and polysilicon. Performing polishing at which a selection ratio of these materials has various requirements depending on usage applications.

As abrasive grains to be subjected to CMP, cerium oxide particles (also referred to as “ceria particles”), silicon oxide particles (also referred to as “silica particles”), aluminum oxide particles (also referred to as “alumina particles”), and the like are known. As a polishing liquid for polishing insulating materials such as silicon oxide, a polishing liquid containing ceria particles is used in many cases from the viewpoint of a high polishing speed for inorganic insulating materials.

For example, JP2017-202967A discloses a method for producing ceria particles by which ceria particles having excellent dispersibility can be obtained.

SUMMARY OF THE INVENTION

The inventors of the present invention produced ceria particles with reference to the method for producing ceria particles disclosed in JP2017-202967A, examined a polishing liquid containing the obtained ceria particles, and found that many defects (in particular, polishing scratches called scratches) may be generated on a polished polishing target surface of a polishing target object in some cases.

In addition, recently, a polishing liquid that enables more selective polishing of silicon oxide than silicon nitride, and a polishing liquid in which a polishing speed for silicon nitride and a polishing speed for silicon oxide are both high have been demanded.

The above-mentioned polishing liquid that enables more selective polishing of silicon oxide than silicon nitride is intended to mean a polishing liquid in which a polishing speed for silicon oxide is relatively higher than a polishing speed for silicon nitride (in other words, a polishing liquid in which a ratio of a polishing speed for silicon oxide to a polishing speed for silicon nitride is higher).

Accordingly, an object of the present invention is to provide a polishing liquid by which defects are less likely to be generated on a polishing target surface and silicon oxide can be more selectively polished than silicon nitride in a case where the polishing liquid is applied to CMP.

Another object of the present invention is to provide a polishing liquid in which detects are less likely to be generated on a polishing target surface and a polishing speed for silicon nitride and a polishing speed for silicon oxide are both high in a case where the polishing liquid is applied to CMP.

Still another object of the present invention is to provide a chemical mechanical polishing method using the above-mentioned polishing liquids.

As a result of intensive studies to achieve the above-described objects, the inventors of the present invention have found that the above-described objects can be achieved by a polishing liquid having a predetermined formulation, and therefore have completed the present invention.

That is, they have found that the above-described objects can be achieved by the following constitution.

[1] A polishing liquid used for chemical mechanical polishing, the polishing liquid comprising:

ceria particles having an average aspect ratio of 1.5 or more; and an anionic polymer or a cationic polymer, wherein a pH of the polishing liquid is 3 to 8, and in a case where the polishing liquid contains the anionic polymer, the polishing liquid further comprising an inorganic acid or an organic acid including at least one group selected from the group consisting of a carboxylic acid group, a phosphoric acid group, a phosphonic acid group, and a sulfonic acid group.

[2] The polishing liquid according to [1], in which an average aspect ratio of the ceria particles is 1.5 to 10.

[3] The polishing liquid according to [1] or [2], in which the ceria particle contains an alkaline earth metal atom in at least one region of a surface thereof.

[4] The polishing liquid according to [3], in which a content of alkaline earth metal atoms is 10 mass ppt to 10 mass ppb with respect to a total mass of the ceria particles.

[5] The polishing liquid according to [3] or [4], in which a mass content ratio of cerium atoms to the alkaline earth metal atoms on surfaces of the ceria particles is 5 or more.

[6] The polishing liquid according to any one of [3] to [5], in which the ceria particle contains an oxide containing the alkaline earth metal atom.

[7] The polishing liquid according to any one of [1] to [6], in which a median diameter D10 of the coda, particles is 10 nm or less.

[8] The polishing liquid according to any one of [1] to [7], in which a median diameter D50 of the ceria particles is 15 nm or less.

[9] The polishing liquid according to any one of [1] to [8], in which a median diameter D90 of the ceria particles is 20 nm or less.

[10] The polishing liquid according to any one of [1] to [9], further comprising one or more selected from the group consisting of a nitrogen-containing heterocyclic ring compound and 4-pyrone.

[11] The polishing liquid according to any one of [1] to [10], further comprising an anionic surfactant.

[12] The polishing liquid according to any one of [1] to [11], in which an average primary particle size of the ceria particles is 20 nm or less.

[13] The polishing liquid according to any one of [1] to [12], further comprising hexametaphosphoric acid.

[14] The polishing liquid according to any one of [1] to [13], in which, in the case where the polishing liquid contains the anionic polymer, the anionic polymer includes a first anionic polymer adsorbed on the ceria particles and a second anionic polymer not adsorbed on the ceria particles, and a ratio of a mass of the first anionic polymer to a mass of the second anionic polymer is 0.001 to 1.00.

[15] The polishing liquid according to any one of [1] to [13], in which the polishing liquid contains the cationic polymer.

[16] The polishing liquid according to [15], in which the cationic polymer includes a first cationic polymer adsorbed on the ceria particles and a second cationic polymer not adsorbed on the ceria particles, and a ratio of a mass of the first cationic polymer to a mass of the second cationic polymer is 0.001 to 1.00.

[17] The polishing liquid according to [15] or [16], in which the cationic polymer has a side chain including a cationic group.

[18] The polishing liquid according to any one of [1] to [14], in which, in a case where the polishing liquid is used for polishing silicon nitride, silicon oxide, or polysilicon, a ratio of a polishing speed for the silicon oxide to a polishing speed for the silicon nitride is 10 to 5,000.

[19] The polishing liquid according to [18], in which a ratio of a polishing speed for the silicon oxide to a polishing speed for the polysilicon is 10 to 5,000.

[20] The polishing liquid according to any one of [1] to [13] and [15] to [17], in which, in a case where the polishing liquid is used for polishing silicon nitride, silicon oxide, or polysilicon, a ratio of a polishing speed for the silicon nitride to a polishing speed for the silicon oxide is 0.25 to 4.0.

[21] The polishing liquid according to [20], in which a ratio of a polishing speed for the silicon nitride to a polishing speed for the polysilicon is 0.25 to 500.

[22] A chemical mechanical polishing method comprising bringing a polishing target surface of a polishing target object into contact with a polishing pad while supplying the polishing liquid according to any one of [1] to [21] to the polishing pad attached to a polishing platen, relatively moving the polishing target object and the polishing pad to polish the polishing target surface, and obtaining a polished polishing target object.

[23] The chemical mechanical polishing method according to [22], in which the polishing target object includes silicon nitride and silicon oxide.

[24] The chemical mechanical polishing method according to [23], in which the polishing target object further includes polysilicon.

According to the present invention, it is possible to provide a polishing liquid by which defects are less likely to be generated on a polishing target surface and silicon oxide can be more selectively polished than silicon nitride in a case where the polishing liquid is applied to CMP.

According to the present invention, it is possible to further provide a polishing liquid in which defects are less likely to be generated on a polishing target surface and a polishing speed for silicon nitride and a polishing speed for silicon oxide are both high in a case where the polishing liquid is applied to CMP.

According to the present invention, it is possible to still further provide a chemical mechanical polishing method using the above-mentioned polishing liquids.

DESCRIPTION OF THE PREFERRED EMBODIMENTS

Hereinafter, the present invention will be described in detail.

The description of constituent elements described below can be made based on representative embodiments of the present invention, but the present invention is not limited to such embodiments.

Numerical value ranges expressed using “to” in the present specification mean a range including numerical values described before and after “to” as the lower limit value and the upper limit value.

In addition, in the present specification, “ppm” means “parts-per-million ($10^{-6}$),” “ppb” means “parts-per-billion ($10^{-9}$),” and “ppt” means “parts-per-trillion ($10^{-12}$).”

Furthermore, in the present specification, 1 Å (angstrom) corresponds to 0.1 nm.

Hereinafter, a first embodiment and a second embodiment of a polishing liquid of the embodiment of the present invention will be described, respectively.

First Embodiment of Polishing Liquid

A polishing liquid of the first embodiment of the present invention is used for chemical mechanical polishing.

The polishing liquid contains ceria particles having an average aspect ratio of 1.5 or more; an anionic polymer; and an inorganic acid or an organic acid including at least one group selected from the group consisting of a carboxylic acid group, a phosphoric acid group, a phosphonic acid group, and a sulfonic acid group, in which a pH of the polishing liquid is 3 to 8.

Regarding the polishing liquid, selectivity of polishing silicon oxide (hereinafter, also referred to as “$SiO_2$”) with respect to silicon nitride (hereinafter, also referred to as “SiN”) is high. Although the mechanism of action is not clear, it is presumed to be due to the following reasons.

Generally, in a case where a pH of a polishing liquid is 3 to 8 (particularly in a case where a pH of a polishing liquid is 4 to 6), a surface charge of SiN is positive and a surface charge of $SiO_2$ is negative. In addition, ceria particles are cationic in a case where a pH of a polishing liquid is 3 to 8.

Accordingly, due to the electrical relationship, ceria particles and SiN tend to repel each other and the ceria particles and $SiO_2$ tend to conic into contact with each other easily. On the other hand, polishing of SiN tends to proceed easily in a case where a surface charge of SiN is positive. Therefore, in a case where the polishing liquid does not contain an anionic polymer, and an inorganic acid or an organic acid containing at least one group selected from the group consisting of a carboxylic acid group, a phosphoric acid group, a phosphonic acid group, and a sulfonic acid group (refer to Comparative Example 1A in the section of Examples), selectivity of polishing $SiO_2$ with respect to SiN is insufficient.

On the other hand, in a case where the polishing liquid contains an anionic polymer, and an inorganic acid or an organic acid containing at least one group selected from the group consisting of a carboxylic acid group, a phosphoric acid group, a phosphonic acid group, and a sulfonic acid group (the polishing liquid of the first embodiment), it is presumed that these components are present on a surface of SiN and act to inhibit polishing of SiN due to ceria particles by an electrical relationship. As a result, it is considered that selectivity of polishing $SiO_2$ with respect to SiN is increased.

Furthermore, in a case where an average aspect ratio of the ceria particles is less than 1.5, it is difficult to adjust a polishing selection ratio of SiN and $SiO_2$ in many cases.

Furthermore, defects (particularly scratches) are unlikely to be generated on a polishing target surface of a polishing target object which has been polished by chemical mechanical polishing using the above-mentioned polishing liquid. Although the mechanism of action is not clear, it is presumed to be due to the following reasons.

It is considered that, in a case where the number of aggregated particles in the polishing liquid increases due to aggregation of ceria particles, a polishing target surface is easily scratched due to coarse aggregated particles. On the other hand, in a case where the polishing liquid contains an anionic polymer, and an inorganic acid or an organic acid containing at least one group selected from the group consisting of a carboxylic acid group, a phosphoric acid group, a phosphonic acid group, and a sulfonic acid group, it is considered that aggregation of ceria particles is inhibited, and as a result, generation of defects on a polishing target surface can be inhibited.

Hereinafter, various components and physical properties contained in the polishing liquid of the first embodiment will be described in detail.

Ceria Particles

The polishing liquid of the first embodiment contains ceria particles. The ceria particles function as abrasive grains for polishing a polishing target object.

An average aspect ratio of the ceria particles is 1.5 or more, and it is preferably 5.0 or more from the viewpoint of easily adjusting a polishing selection ratio of SiN and $SiO_2$. In addition, the upper limit of the average aspect ratio of the ceria particles is not particularly limited, and for example, it is preferably 15 or less and more preferably 10 or less.

The average aspect ratio of the ceria particles is obtained by measuring a major axis and a minor axis for every arbitrary 100 particles observed with the above-mentioned transmission electron microscope, calculating aspect ratios (major axis/minor axis) of the respective particles, and arithmetically averaging the aspect ratios of the 100 particles. The major axis of a particle means a length of the particle in a major axis direction, and the minor axis of a particle means a length of the particles in a direction orthogonal to the major axis direction of the particle.

However, in a case where a commercially available product is used as ceria particles, a catalog value is preferentially adopted as an average aspect ratio of the ceria particles.

The ceria particles preferably contain an alkaline earth metal atom in at least one region of a surface thereof, from the viewpoint that then, aggregation of the ceria particles is inhibited and generation of defects on a polishing target surface is further inhibited. The ceria particles particularly preferably contain an alkaline earth metal atom as an oxide of an alkaline earth metal from the viewpoint that then, aggregation of the ceria particles is inhibited and generation of defects on a polishing target surface is further inhibited.

The alkaline earth metal atom is not particularly limited, but at least one selected from the group consisting of a calcium atom, a strontium atom, and a barium atom is preferable from the viewpoint that they are excellent in manufacturability.

A content of the alkaline earth metal atom is not particularly limited, but it is preferably 10 mass ppt or more, is more preferably 20 mass ppt or more, and is even more preferably 50 mass ppt or more with respect to a total mass of the ceria particles from the viewpoint that then, efficiency of sintering is excellent in a step of sintering particles (corresponding to Step B to be described later), and defects on a polishing target surface are further inhibited. Meanwhile, the upper limit value of the content of the alkaline earth metal atom is not particularly limited, but for example, it is 15 mass ppb or less, and it is preferably 10 mass ppb or less and is more preferably 8 mass ppb or less from the viewpoint that defects on a polishing target surface are then further inhibited.

Furthermore, a mass content ratio of cerium atoms to alkaline earth metal atoms (cerium atoms/alkaline earth metal atoms) on surfaces of the ceria particles is, for example, 5 or more, and it is preferably 10 or more and is more preferably 15 or more from the viewpoint that polishing power is then excellent. Meanwhile, the upper limit value of the mass content ratio of cerium atoms to alkaline earth metal atoms on the surfaces of the ceria particles is not particularly limited, and for example, it is 150 or less, is preferably 100 or less, and is more preferably 90 or less from the viewpoint that then, aggregation of the ceria particles is inhibited, and generation of defects on a polishing target surface is further inhibited.

A mass content ratio of cerium atoms to the alkaline earth metal atoms on the surfaces of the ceria particles can be measured by the following method.

First, ceria particles are mixed with gelatin, and the obtained mixture is applied in a paste form on a Si substrate (film thickness of a coating film: 1 μm). Next, the obtained coating film is dried at high temperature, and then gelatin is sintered from the substrate.

ESCA (Electron Spectroscopy for Chemical Analysis) measurement is performed on the obtained sample to evaluate each atom concentration (where each atom concentration is obtained as an average value obtained by arithmetically averaging each atom concentration obtained in 10 regions of the sample measured by ESCA).

Furthermore, binding energy of each element after the measurement is evaluated, and thereby a ratio of metal elements and oxide elements can be measured from the existing ratio.

For the ESCA measurement, for example, a Thermo Scientific™ K-Alpha™ system can be used.

A median diameter D10 of the ceria particles is not particularly limited, but for example, it is 250 nm or less, and it is preferably 10 nm or less from the viewpoint of excellent defect performance. The lower limit thereof is not particularly limited, but it is preferably 1 nm or more.

The median diameter D10 means a 10% diameter in cumulative distribution of particle sizes.

A median diameter D50 of the ceria particles is not particularly limited, but for example, it is 450 nm or less, and it is preferably 15 nm or less from the viewpoint of excellent defect performance. The lower limit thereof is not particularly limited, but it is preferably 3 nm or more.

The median diameter D50 means a 50% diameter in cumulative distribution of particle sizes.

A median diameter D90 of the ceria particles is not particularly limited, but for example, it is 550 nm or less, and it is preferably 20 nm or less from the viewpoint of excellent defect performance. The lower limit thereof is not particularly limited, but it is preferably 5 nm or more.

The median diameter D90 means a 90% diameter in cumulative distribution of particle sizes.

The median diameters can be evaluated using a particle size distribution measurement device (for example, SALD-7500 nano, manufactured by Shimadzu Corporation).

An average primary particle size of the ceria particles is not particularly limited, and for example, it is 500 nm or less, and it is preferably 20 nm or less and is more preferably 15 nm or less from the viewpoint that generation of defects on a polishing target surface is then further inhibited.

The lower limit value of the average primary particle size of the ceria particles is not particularly limited, but for example, it is 1 nm or more, and it is more preferably 3 nm or more from the viewpoint that then, aggregation of the ceria particles is inhibited and temporal stability of the polishing liquid is improved.

An average primary particle size is obtained by measuring particle sizes (equivalent circle diameters) of 1,000 primary particles arbitrarily selected from an image captured using a transmission electron microscope TEM2010 (pressurization voltage: 200 kV) manufactured by JEOL Ltd., and arithmetically averaging the values. The equivalent circle diameter is a diameter of a circle assuming a true circle having the same projected area as a projected area of a particle in a case of observation.

However, in a case where a commercially available product is used as ceria particles, a catalog value is preferentially adopted as an average primary particle size of the ceria particles.

The lower limit value of a content of the ceria particles is not particularly limited, but for example, it is 0.1% by mass or more and is preferably 0.5% by mass or more with respect to a total mass of the polishing liquid.

The upper limit value of a content of the ceria particles is not particularly limited, but for example, it is 10% by mass or less with respect to a total mass of the polishing liquid, and from the viewpoint that a ratio of a polishing speed for $SiO_2$ to a polishing speed for SiN is higher, it is preferably 8.0% by mass or less, is more preferably 5.0% by mass or less, is even more preferably 1.8% by mass or less, and is particularly preferably 1.2% by mass or less.

As the ceria particles, one kind thereof may be used alone, or two or more kinds thereof may be used in combination. In a case where two or more kinds of ceria particles are used in combination, a total content thereof is preferably within the above-mentioned range.

Method for Producing Ceria Particles

The above-described ceria particles containing an alkaline earth metal atom in at least one region of the surface thereof can be produced by, for example, a production method including the procedure of Steps A to C.

Step A: a step of stirring a mixed solution containing at least a solvent and a raw material containing a cerium atom (hereinafter, also referred to as "cerium raw materials") at a stirring speed of 500 to 5,000 rpm to incorporate at least one cerium atom, and thereby obtaining a dispersion liquid containing cerium atoms, and particles in which at least one region of a surface is coated with an alkaline earth metal salt of a polycarboxylic acid.

Step B: a step of firing the particles obtained in Step A.

Step C: a step of dissolving at least a part of an oxide which contains an alkaline earth metal atom and is contained in the baked product obtained in Step B, and thereby obtaining ceria particles.

Steps A to C will be described in detail below.

Step A

Step A preferably includes Step A1 and Step A2 or includes Step A3.

Step A1

A step of dispersing a mixed liquid obtained by mixing a solvent and cerium raw materials at a stirring speed of 500 to 5,000 rpm, and thereby preparing a dispersion liquid.

Step A2

A step of further adding polycarboxylic acid and an alkaline earth metal salt to the dispersion liquid obtained in Step A1, and thereby obtaining a dispersion liquid containing cerium atoms, and particles in which at least one region of a surface is coated with an alkaline earth metal salt of a polycarboxylic acid.

Step A3

A step of dispersing a mixed solution containing a solvent, cerium raw materials, a polycarboxylic acid, and an alkaline earth metal salt at a stirring speed of 500 to 5,000 rpm, and thereby obtaining a dispersion liquid containing cerium atoms, and particles in which at least one region of a surface is coated with an alkaline earth metal salt of a polycarboxylic acid.

For example, the cerium raw materials can be coated with an alkaline earth metal salt of a polycarboxylic acid by carrying out Step A.

Hereinafter, various components used in Step A will be described.

As the solvent, polar solvents such as water, methanol, ethanol, isopropanol, and acetone are preferable. The solvent is preferably at least one of water or ethanol and is more preferably water from the viewpoint of easy handling. Water is not particularly limited, but deionized water, ion exchange water, ultrapure water, and the like are preferable.

As the solvent, one kind thereof may be used alone, or two or more kinds thereof may be used in combination.

The cerium raw materials are not particularly limited, and examples thereof include inorganic acid salts and organic acid salts.

Examples of inorganic acid salts include carbonates, oxycarbonates, nitrates, and sulfates, and hydrates thereof. Examples of organic acid salts include oxalates, malonates, and the like.

As the cerium raw materials, at least one selected from the group consisting of carbonates, carbonate hydrates, oxycarbonates, oxycarbonate hydrates, oxalates, and oxalates hydrates is preferable from the viewpoint of easily lowering solubility in a solvent (for example, water).

As the cerium raw materials, one kind thereof may be used alone, or two or more kinds thereof may be used in combination.

As the polycarboxylic acid, at least one selected from the group consisting of a homopolymer of acrylic acid (polyacrylic acid), a homopolymer of methacrylic acid (polymethacrylic acid), a copolymer of acrylic acid, and a copolymer of methacrylic acid (excluding copolymers of acrylic acid) is preferable from the viewpoint of excellent adsorption to the cerium raw materials.

As the polycarboxylic acid, one kind thereof may be used alone, or two or more kinds thereof may be used in combination.

A weight-average molecular weight of the polycarboxylic acid is preferably 1,000 or more, more preferably 2,000 or more, even more preferably 4,000 or more, particularly preferably 5,000 or more, and most preferably 7,000 or more from the viewpoint of enhancing adsorptivity to the cerium raw materials (for example, cerium carbonate). The weight-average molecular weight of the polycarboxylic acid is preferably 500,000 or less, more preferably 200,000 or less, even more preferably 100,000 or less, particularly preferably 50,000 or less, and most preferably 10,000 or less from the viewpoint of easily preventing excessive aggregation of abrasive grains. The weight-average molecular weight of the polycarboxylic acid can be measured by gel permeation chromatography under the following conditions using a calibration curve of standard polystyrene.

Condition

Sample: 10 μL

Standard polystyrene: manufactured by TOSOH CORPORATION, standard polystyrene (molecular weight: 190,000, 17,900, 9,100, 2,980, 578, 474, 370, 266).

Detector: RI-monitor manufactured by Hitachi, Ltd., product name "L-3000"

Integrator: GPC integrator manufactured by Hitachi, Ltd., product name "D-2200"

Pump: product name "L-6000" manufactured by Hitachi, Ltd.

Degassing device: product name "Shodex DEGAS" manufactured by Showa Denko K.K.

Column: product name "GL-R440," "GL-R430," and "GL-R420," which are manufactured by Hitachi Chemical Co., Ltd., are connected in this order and used.

Eluent: tetrahydrofuran (THF)

Measurement temperature: 23° C.

Flow rate: 1.75 mL/min

Measurement time: 45 minutes

An alkaline earth metal atom of an alkaline earth metal salt is not particularly limited, but at least one selected from the group consisting of a calcium atom, a strontium atom, and a barium atom is preferable from the viewpoint that easily increasing solubility of an alkaline earth metal oxide in a solution.

Furthermore, as the alkaline earth metal salt, at least one selected from the group consisting of nitrate, sulfate, hydrochloride, acetate, and lactate of alkaline earth metal is preferable from the viewpoint of easily increasing solubility of an alkaline earth metal oxide in a solution.

As the alkaline earth metal salt, one kind thereof may be used alone, or two or more kinds thereof may be used in combination.

The lower limit value of a molar ratio of cerium atoms of the cerium raw materials to carboxy groups (the number of carboxy groups) of a polycarboxylic acid (a ratio of the number of moles; cerium atoms/carboxy groups of a polycarboxylic acid) is preferably 0.1 or more, is more preferably 0.5 or more, is even more preferably 1 or more, particularly preferably 10 or more, and most preferably 20 or more from the viewpoint of easily covering the cerium raw materials with alkaline earth metal salts of polycarboxylic acid. The number of carboxy groups (number of moles) of the polycarboxylic acid can be calculated, for example, by dividing a blending amount (g) of a polycarboxylic acid by a molecular weight (g/mol) of constituent monomers.

The upper limit value of a molar ratio of cerium atoms of the cerium raw materials to carboxy groups (the number of carboxy groups) of a polycarboxylic acid (a ratio of the number of moles; cerium atoms/carboxy groups of a polycarboxylic acid) is preferably 500 or less, is more preferably 300 or less, is even more preferably 200 or less, particularly preferably 150 or less, and most preferably 120 or less from the viewpoint of easily covering the cerium raw materials with alkaline earth metal salts of polycarboxylic acid.

The lower limit value of a molar ratio of alkaline earth metal atoms of an alkaline earth metal salt to carboxy groups (the number of carboxy groups) of a polycarboxylic acid (a ratio of the number of moles; alkaline earth metal atoms/carboxy groups of a polycarboxylic acid) is preferably 0.01 or more, is more preferably 0.05 or more, is even more preferably 0.08 or more, and particularly preferably 0.1 or more from the viewpoint of accelerating generation of alkaline earth metal salts of polycarboxylic acid.

The upper limit value of a molar ratio of alkaline earth metal (alkaline earth metal atoms) of an alkaline earth metal salt to carboxy groups (the number of carboxy groups) of a polycarboxylic acid (a ratio of the number of moles; alkaline earth metal/carboxy groups of a polycarboxylic acid) is preferably 100 or less, is more preferably 80 or less, is even more preferably 60 or less, particularly preferably 40 or less, and most preferably 20 or less from the viewpoint of accelerating generation of alkaline earth metal salts of polycarboxylic acid.

In Step A, a stirring speed in a case of dispersing the cerium raw materials in the solvent is 500 to 5,000 rpm. In a case where the stirring speed is 500 rpm or more, ceria particles having a small average primary particle size and a small median diameter can be obtained. Furthermore, in a case where the stirring speed is 5,000 rpm or less, a particle size of particles and distribution of a degree of association can be controlled (that is, more uniform particles can be obtained).

The stirring speed is preferably 1,000 rpm or more and is more preferably 1,200 rpm or more, and it is preferably 4,500 rpm or less and is more preferably 3,500 rpm or less.

The stirring time is not particularly limited, but for example, it is 1 to 120 minutes, is preferably 1 to 60 minutes, and is more preferably 1 to 40 minutes.

Step B

In Step B, the particles obtained in Step A are baked (for example, sintered).

In Step B, for example, the residue obtained by removing at least part of the solvent from the dispersion liquid obtained in Step A is baked. A method of removing the solvent is not particularly limited, and methods such as centrifugal separation, reduced pressure drying, and atmospheric drying can be applied. Furthermore, a method of baking the obtained residue is not particularly limited, and methods such as a baking method using a rotary kiln or an electric furnace can be applied.

A baking temperature in the baking step is preferably 300° C. or higher, more preferably 500° C. or higher, and even more preferably 600° C. or higher from the viewpoint that cerium atoms in the particles obtained in Step A are then easily oxidized. The baking temperature in the baking step is preferably 1,500° C. or lower, more preferably 1,200° C.

or lower, and even more preferably 1,000° C. or lower from the viewpoint of preventing excessive crystallization of particles.

A baking time is not particularly limited, but for example, it is 5 to 300 minutes and is preferably 10 to 200 minutes.

Step C

In Step C, at least part of an alkaline earth metal oxide contained in the baked product obtained in Step B is dissolved to obtain ceria particles.

Specifically, Step C is preferably a step of dispersing the baked product obtained in Step B in a solution to dissolve an alkaline earth metal oxide.

A solution used for dissolution is preferably a solution (for example, an aqueous solution) in which liquidity is adjusted to be acidic by at least one acid component selected from the group consisting of inorganic acids (for example, nitric acid, sulfuric acid, hydrochloric acid, and the like) and organic acids (for example, acetic acid, oxalic acid, and the like) from the viewpoint of easily dissolving an alkaline earth metal oxide.

Dissolution is preferably performed while applying ultrasonic waves from the viewpoint of easily dissolving an alkaline earth metal oxide.

A molar ratio of acid component to alkaline earth metal (acid component/alkaline earth metal) is preferably 0.4 or more, more preferably 0.6 or more, and even more preferably 0.8 or more from the viewpoint that liquidity can then be easily kept acidic even in a case where an alkaline earth metal oxide is dissolved.

Anionic Polymer

The polishing liquid of the first embodiment contains an anionic polymer. Examples of anionic polymers include a polymer derived from a monomer containing an acid group or a salt thereof, and a copolymer containing them.

The acid group is not particularly limited, but examples thereof include a carboxylic acid group, a sulfonic acid group, a phosphoric acid group, a phosphonic acid group, and the like.

Specific examples of anionic polymers include polyacrylic acid and salts thereof, and copolymers containing them; polymethacrylic acid and salts thereof, and copolymers containing them; polyamic acids and salts thereof, and copolymers containing them; and polycarboxylic acids such as polymaleic acid, polyitaconic acid, polyfumaric acid, poly(p-styrenecarboxylic acid), and polyglyoxylic acid, and salts thereof, and copolymers containing them.

Among the examples, the anionic polymer preferably contains at least one selected from the group consisting of polyacrylic acid, polymethacrylic acid, a copolymer containing polyacrylic acid and polymethacrylic acid, and salts thereof.

The anionic polymer may be ionized in the polishing liquid.

The lower limit value of a weight-average molecular weight of the anionic polymer is, for example, 1,000 or more, is preferably 2,000 or more, and is more preferably 15,000 or more from the viewpoint that a ratio of a polishing speed for SiO2 to a polishing speed for SiN is then higher. In addition, the upper limit value of a weight-average molecular weight of the anionic polymer is, for example, 100,000 or less, is preferably 50,000 or less, and is more preferably 30,000 or less from the viewpoint that generation of defects on a polishing target surface can then be further inhibited.

The weight-average molecular weight of the anionic polymer is a polystyrene conversion value by gel permeation chromatography (GPC) method. The GPC method is based on a method using HLC-8020GPC (manufactured by TOSOH CORPORATION), using TSKgel SuperHZM-H, TSKgel SuperHZ4000, and TSKgel SuperHZ2000 (manufactured by TOSOH CORPORATION, 4.6 mm ID×15 cm) as columns, and using tetrahydrofuran (THF) as an eluent.

The lower limit value of a content of the anionic polymer is preferably 0.01% by mass or more, more preferably 0.2% by mass or more, and even more preferably 1.5% by mass or more with respect to a total mass of the polishing liquid, from the viewpoint that then, selectivity of $SiO_2$ polishing with respect to SiN is further improved, and generation of defects on a polishing target surface can be further inhibited.

The upper limit value of a content of the anionic polymer is preferably 10% by mass or less, more preferably 5% by mass or less, even more preferably 4% by mass or less, particularly preferably 2% by mass or less, and most preferably 0.8% by mass or less with respect to a total mass of the polishing liquid, from the viewpoint that temporal stability of the polishing liquid is then improved.

As the anionic polymer, one kind thereof may be used alone, or two or more kinds thereof may be used in combination. In a case where two or more kinds of anionic polymers are used in combination, a total content thereof is preferably within the above-mentioned range.

In the polishing liquid, the anionic polymer includes a first anionic polymer adsorbed on the ceria particles (hereinafter also referred to as "adsorbed component") and a second anionic polymer not adsorbed on the ceria particles (hereinafter also referred to as "free component").

The lower limit value of a mass content ratio of the adsorbed component to the free component (mass of adsorbed component/mass of free component) is preferably 0.001 or more from the viewpoint that generation of defects on a polishing target surface can then be further inhibited. The upper limit value of a mass content ratio of the adsorbed component to the free component is preferably 1.00 or less from the viewpoint that generation of defects on a polishing target surface can then be further inhibited.

A content of the adsorbed component and a content of the free component in the polishing liquid can be measured by the following methods.

The polishing liquid is subjected to ultracentrifugation, and components contained in the supernatant in the liquid after ultracentrifugation and a content thereof are identified by a gas chromatography (GC/MS) method or a liquid chromatography (LC/MS) method. Accordingly, a content of the free component is obtained. A content of the adsorbed component can be obtained by subtracting the content of the above-mentioned free component from a total mass of the anionic polymer contained in the polishing liquid (a total amount of the anionic polymer added).

Inorganic Acid or Organic Acid Including at Least One Group Selected from the Group Consisting of Carboxylic Acid Group, Phosphoric Acid Group, Phosphonic Acid Group, and Sulfonic Acid Group The polishing liquid of the first embodiment contains an inorganic acid or an organic acid (hereinafter also referred to as a "specific acid") containing at least one group selected from the group consisting of a carboxylic acid group, a phosphoric acid group, a phosphonic acid group, and a sulfonic acid group. In a case where the specific acid is used, a ratio of a polishing speed for $SiO_2$ to a polishing speed for SiN is higher, and it is easier to adjust a pH within a predetermined range. The carboxylic acid group, phosphoric acid group, phosphonic acid group, and sulfonic acid group may be ionized in the polishing liquid. The tem "organic acid" referred to herein does not include the above-mentioned anionic polymer, surfactant (for example, dodecylbenzenesulfonic acid), and heterometaphosphoric acid. In addition, a molecular weight of the specific acid is preferably 1,000 or less.

Examples of inorganic acids and organic acids containing a carboxylic acid group include acetic acid, oxalic acid, malic acid, glycine, 2-pyridinecarboxylic acid, and the like. Examples of inorganic acids and organic acids containing a phosphoric acid group include phosphoric acid and the like. Examples of organic acids containing a phosphonic acid group include phosphonic acid, 1-hydroxyethane-1,1-diphosphonic acid, and the like. Examples of inorganic acids and organic acids containing a sulfonic acid group include sulfuric acid, p-toluenesulfonic acid (pTSA), and the like.

A content of the specific acid is preferably 0.0001% to 5.0% by mass and is more preferably 0.1% to 1.2% by mass with respect to a total mass of the polishing liquid.

As the specific acid, one kind thereof may be used alone, or two or more kinds thereof may be used in combination. In a case where two or more kinds of specific acids are used in combination, a total content thereof is preferably within the above-mentioned range.

Optional Components

The polishing liquid of the first embodiment may further contain optional components in addition to the above-mentioned components. Examples of optional components include a nitrogen-containing heterocyclic ring compound, 4-pyrone, a surfactant, hexametaphosphoric acid, and the like.

Nitrogen-Containing Heterocyclic Ring Compound and 4-Pyrone

The polishing liquid of the first embodiment preferably contains at least one selected from the group consisting of a nitrogen-containing heterocyclic ring compound and 4-pyrone.

The nitrogen-containing heterocyclic ring compound means a compound containing a heterocyclic ring containing one or more nitrogen atoms. In a case where the polishing liquid contains a nitrogen-containing heterocyclic ring compound, a ratio of a polishing speed for $SiO_2$ to a polishing speed for SiN is higher.

The number of nitrogen atoms contained in a heterocyclic ring of the nitrogen-containing heterocyclic ring compound is preferably 2 or more and is more preferably 2 to 4 from the viewpoint that a ratio of a polishing speed for $SiO_2$ to a polishing speed for SiN is then higher.

The nitrogen-containing heterocyclic ring compound may contain a heteroatom other than nitrogen (for example, an oxygen atom) in the heterocyclic ring thereof. The nitrogen-containing heterocyclic ring contained in the nitrogen-containing heterocyclic ring compound is preferably a 5- to 6-membered ring and is more preferably a 5-membered ring.

Examples of nitrogen-containing heterocyclic ring compounds include compounds having an imidazole skeleton, a pyrazole skeleton, a triazole skeleton, a tetrazole skeleton, a thiadiazole skeleton, or an oxadiazole skeleton, and a compound having an imidazole skeleton is preferable from the viewpoint that a ratio of a polishing speed for $SiO_2$ to a polishing speed for SiN is then higher.

Furthermore, the nitrogen-containing heterocyclic ring compound may be a compound having a polycyclic structure having a fused ring, and specific examples thereof include compounds having a purine skeleton, an indazole skeleton, a benzimidazole skeleton, a benzothiadiazole skeleton, or a naphthimidazole skeleton.

Specific examples of nitrogen-containing heterocyclic ring compounds include histidine, imidazole, 4-imidazolecarboxylic acid, 5-methylbenzotriazole, 5-aminobenzotriazole, benzotriazole, 5,6-dimethylbenzotriazole, 3-amino-1,2,4-triazole, 1,2,4-triazole, 3,5-dimethylpyrazole, and pyrazole. Among them, histidine, imidazole, and 4-imidazolecarboxylic acid, which are compounds having an imidazole skeleton, are preferable from the viewpoint that a ratio of a polishing speed for $SiO_2$ to a polishing speed for SiN is then higher.

A content of the nitrogen-containing heterocyclic ring compound is preferably 0.001% to 1% by mass and more preferably 0.01% to 0.5% by mass with respect to a total mass of the polishing liquid, from the viewpoint that a ratio of a polishing speed for $SiO_2$ to a polishing speed for SiN is then higher.

As the nitrogen-containing heterocyclic ring compound, one kind thereof may be used alone, or two or more kinds thereof may be used in combination. In a case where two or more kinds of nitrogen-containing heterocyclic ring compounds are used in combination, a total content thereof is preferably within the above-mentioned range.

A content of 4-pyrone is preferably 0.001% to 1% by mass, is more preferably 0.01% to 0.1% by mass, and is particularly preferably 0.05% to 1% by mass with respect to a total mass of the polishing liquid.

A content of hexametaphosphoric acid is preferably 0.001% to 1% by mass, more preferably 0.01% to 1% by mass, and particularly preferably 0.05% to 1% by mass with respect to a total mass of the polishing liquid.

Surfactant

The polishing liquid of the first embodiment may contain a surfactant.

The surfactant is not particularly limited, but an ionic surfactant (a anionic surfactant or a cationic surfactant) is preferably contained from the viewpoint that selectivity of polishing $SiO_2$ with respect to polysilicon (hereinafter, also referred to as "poly-Si") can be increased.

Specific examples of anionic surfactants include carboxylic acid salts, sulfonic acid salts such as alkylbenzene sulfonic acid, sulfuric acid ester salts, phosphoric acid ester salts, and the like.

A content of the anionic surfactant is preferably 0.0001% to 1.0% by mass and is more preferably 0.001% to 0.5% by mass with respect to a total mass of the polishing liquid.

As the anionic surfactant, one kind thereof may be used alone, or two or more kinds thereof may be used in combination. In a case where two or more kinds of anionic surfactants are used in combination, a total content thereof is preferably within the above-mentioned range.

Specific examples of cationic surfactants include aliphatic amine salts, aliphatic quaternary ammonium salts, benzalkonium chloride salts, benzethonium chloride, pyridinium salts, imidazolinium salts, and the like.

A content of the cationic surfactant is preferably 0.0001% to 1% by mass and is more preferably 0.001% to 0.5% by mass with respect to a total mass of the polishing liquid.

As the cationic surfactant, one kind thereof may be used alone, or two or more kinds thereof may be used in combination. In a case where two or more kinds of cationic surfactants are used in combination, a total content thereof is preferably within the above-mentioned range.

Among the ionic surfactants, it is preferable to incorporate an anionic surfactant from the viewpoint that defects on a polishing target surface can then be further inhibited.

Water

The polishing liquid of the first embodiment preferably contains water. Water contained in the polishing liquid is not particularly limited, but it is preferable to use ion exchange water, pure water, or the like. A content of water is not particularly limited, but it is preferably 90% to 99% by mass with respect to a total mass of the polishing liquid.

Other Components

The polishing liquid of the first embodiment may contain components (other components) other than the components described above, which are used in the polishing liquid for CMP, as long as the effects of the present invention are not impaired.

PH

A pH of the polishing liquid of the first embodiment is 3 to 8, and it is preferably 4 to 6 from the viewpoint that then, polishing selectivity of $SiO_2$ with respect to SiN is higher and defects on a polishing target surface can be further inhibited.

The pH of the polishing liquid can be measured with a pH meter, and a measurement temperature is 25° C. As the pH meter, it is possible to use product name, “LAQUA series” (manufactured by HORIBA, Ltd.).

A method of adjusting a pH within the above-mentioned range is not limited to this, and examples thereof include a method of adding the above-mentioned specific acid.

Ratio of Polishing Speed

In a case where the polishing liquid is used for polishing SiN. $SiO_2$, and their derivatives, a ratio of a polishing speed for $SiO_2$ and its derivatives to a polishing speed for SiN and its derivatives is preferably 10 to 5,000.

A ratio of a polishing speed for $SiO_2$ and derivatives thereof to a polishing speed for SiN and derivatives thereof means a ratio of a polishing speed of $SiO_2$ to a polishing speed of SiN, a ratio of a polishing speed of $SiO_2$ to a polishing speed of derivatives of SiN, a ratio of a polishing speed of derivatives of $SiO_2$ to a polishing speed of SiN, and a ratio of a polishing speed of derivatives of $SiO_2$ to a polishing speed of derivatives of SiN.

Specific examples of derivatives of $SiO_2$ include SiOC and $SiO_2$ that has been subjected to a doping treatment.

Specific examples of derivatives of SiN include SiON and SiN that has been subjected to a doping treatment.

In a case where the polishing liquid is used to polish $SiO_2$, poly-Si, and derivatives thereof, a ratio of a polishing speed for $SiO_2$ and its derivative to a polishing speed for poly-Si and its derivative is more preferably 10 to 5,000.

A ratio of a polishing speed for $SiO_2$, and derivatives thereof to a polishing speed for poly-Si and derivatives thereof means a ratio of a polishing speed of $SiO_2$, to a polishing speed of poly-Si, a ratio of a polishing speed of $SiO_2$, to a polishing speed of derivatives of poly-Si, a ratio of a polishing speed of derivatives of $SiO_2$, to a polishing speed of poly-Si, and a ratio of a polishing speed of derivatives of $SiO_2$, to a polishing speed of derivatives of poly-Si.

Specific examples of derivatives of poly-Si include poly-Si (modified polysilicon) that has been subjected to a doping treatment, and the like.

Second Embodiment of Polishing Liquid

A polishing liquid of a second embodiment of the present invention is a polishing liquid used for chemical mechanical polishing.

It contains ceria particles having an average aspect ratio of 1.5 or more, and a cationic polymer, and has a pH of 3 to 8.

With the polishing liquid, a polishing speed for SiN and a polishing speed for $SiO_2$ are both high. Although the mechanism of action is not clear, it is presumed to be due to the following reasons.

Generally, ceria particles achieve high-speed polishing through a chemical reaction with a $SiO_2$ surface, as represented by glass polishing. Meanwhile, SiN is unlikely to cause such a chemical reaction with ceria particles. On the other hand, in a case where a polishing liquid contains a cationic polymer, the interaction between SiN and ceria particles is changed by the action of the cationic polymer, and it is considered, as a result, both a polishing speed for SiN and a polishing speed for $SiO_2$ increase. Although the reason for this is not clear, it is presumed that a chemical reaction is progressing and/or frequency of physical contact is increasing.

Furthermore, defects (particularly scratches) are unlikely to be generated on a polishing target surface of a polishing target object which has been polished by chemical mechanical polishing using the above-mentioned polishing liquid. Although the mechanism of action is not clear, it is presumed to be due to the following reasons.

It is considered that, in a case where the number of aggregated particles in the polishing liquid increases due to aggregation of ceria particles, a polishing target surface is easily scratched due to coarse aggregated particles. On the other hand, in a case where the polishing liquid contains a cationic polymer, ceria particles are likely to repel each other and the ceria particles are less likely to aggregate, and thereby generation of defects on a polishing target surface due to coarse aggregated particles can be inhibited.

Hereinafter, the polishing liquid of the second embodiment will be described in detail.

Ceria Particles

The polishing liquid of the second embodiment contains ceria particles.

The ceria particles contained in the polishing liquid of the second embodiment are the same as the above-described ceria particles contained in the polishing liquid of the first embodiment, and the same applies to preferable aspects thereof.

The lower limit value of a content of the ceria particles is not particularly limited, but for example, it is 0.1% by mass or more, preferably 0.5% by mass or more, and more preferably 2.0% by mass or more with respect to a total mass of the polishing liquid from the viewpoint that a polishing speed for SiN and a polishing speed for $SiO_2$ are then both higher.

The upper limit value of a content of the ceria particles is not particularly limited, but for example, it is 10% by mass or less, is preferably 8.0% by mass or less, and more preferably 5.0% by mass or less with respect to a total mass of the polishing liquid from the viewpoint that a polishing speed for SiN and a polishing speed for $SiO_2$ are then both higher.

As the ceria particles, one kind thereof may be used alone, or two or more kinds thereof may be used in combination. In a case where two or more kinds of ceria particles are used in combination, a total content thereof is preferably within the above-mentioned range.

Cationic Polymer

The polishing liquid of the second embodiment contains a cationic polymer.

The cationic polymer is not particularly limited as long as it is a polymer containing a group (hereinafter, also referred to as a "cationic group") exhibiting canonicity at pH 3 to 8 (particularly preferably at pH 3 to 4). Examples thereof include polymers containing cationic groups such as a monovalent group represented by $—NR_AR_B$ or $—N^+R_AR_BR_C.X^-$, and a divalent group represented by $—NR_A—$ or $—N^+R_AR_B—.X^-$ (where $R_A$, $R_B$, and $R_C$ each independently represent a hydrogen atom or an organic group (for example, an alkyl group), and $X^-$ represents a counter anion).

Among them, the cationic polymer is preferably a polymer containing an onium salt structure, and is more preferably a polymer containing a substituted or unsubstituted ammonium salt structure from the viewpoint that generation of defects on a polishing target surface can then be further inhibited.

Examples of substituted or unsubstituted ammonium salt structures include a monovalent ammonium salt structure represented by General Formula (1) and a divalent ammonium salt structure represented by General Formula (2).

(1)

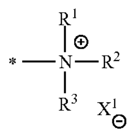

(2)

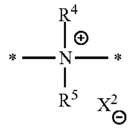

In General Formula (1), $R^1$, $R^2$, and $R^3$ each independently represent a hydrogen atom or an organic group. $X^1$ represents a counter anion. * represents a bonding position. In addition, in General Formula (2), $R^4$ and $R^5$ each independently represent a hydrogen atom or an organic group. $X^2$ represents a counter anion. * represents a bonding position.

The organic group represented by $R^1$, $R^2$, $R^3$, $R^4$, and $R^5$ is preferably, for example, an allyl group or an alkyl group having 1 to 10 carbon atoms, is more preferably an alkyl group having 1 to 6 carbon atoms, and is even more preferably an alkyl group having 1 to 3 carbon atoms. In addition, $R^1$, $R^2$, and $R^3$ may be bonded to each other to form a ring.

The monovalent ammonium salt structure represented by General Formula (1) and the divalent ammonium salt structure represented by General Formula (2) are bonded to other sites of a cationic polymer at a bonding position represented by *.

The anions represented by $X^1$ and $X^2$ are not particularly limited, and examples thereof include hydroxide ion, chlorine ion, bromine ion, iodine ion, fluorine ion, and alkylsulfate ion.

The cationic polymer may be a linear polymer or a dendritic polymer.

In a case where the cationic polymer is a linear polymer, a structure of a main chain is not particularly limited, and examples thereof include polyurethane, polyacrylate, polymethacrylate, polystyrene, polyester, polyamide, polyimide, polyurea, and the like. Furthermore, the cationic group may be contained in a main chain or in a side chain, but it is preferably contained in a side chain from the viewpoint of its excellent interaction with the ceria particles.

Specific examples of cationic polymers include poly (trimethylaminoethyl-methacrylate methylsulfate), polyethylimine hydrochloride, a copolymer of diallyldimethylammonium chloride (DADMA), a polymer of dimethylaminopropyl acrylamide (DAPAA) or its copolymer, cationized polyvinyl alcohol, and the like.

In addition, examples of commercial products such as cationized polyvinyl alcohol include C-118, C-506, and C-318 (manufactured by Kuraray Co., Ltd.); Gocefimer C-670, Gocefimer C-820, Gosefimer K-200, and Gocefimer K-210 (all of which are manufactured by Nippon Synthetic Chemical Industry Co., Ltd.); and the like.

The lower limit value of a weight-average molecular weight of the cationic polymer is, for example, 1,000 or more, is preferably 2,000 or more, is more preferably 10,000 or more, is even more preferably 15,000 or more, and is particularly preferably 20,000 or more from the viewpoint that a polishing speed for SiN and a polishing speed for $SiO_2$ are then both higher. Furthermore, the upper limit value of a weight-average molecular weight of the cationic polymer is, for example, 100,000 or less, is preferably 50,000 or less, and is more preferably 30,000 or less from the viewpoint that a polishing speed for SiN and a polishing speed for $SiO_2$ are then both higher.

The weight-average molecular weight of the cationic polymer is a polystyrene conversion value by gel permeation chromatography (GPC) method. The GPC method is based on a method using HLC-8020GPC (manufactured by TOSOH CORPORATION), using TSKgel SuperHZM-H, TSKgel SuperHZ4000, and TSKgel SuperHZ2000 (manufactured by TOSOH CORPORATION, 4.6 mm ID×15 cm) as columns, and using tetrahydrofuran (THF) as an eluent.

The lower limit value of a content of the cationic polymer is preferably 0.01% by mass or more and is more preferably 0.2% by mass or more with respect to a total mass of the polishing liquid from the viewpoint that generation of defects on a polishing target surface can then be further inhibited.

The upper limit value of a content of the cationic polymer is preferably 10% by mass or less, more preferably 5% by mass or less, and even more preferably 2% by mass or less with respect to a total mass of the polishing liquid from the viewpoint that generation of detects on a polishing target surface can then be further inhibited.

As the cationic polymer, one kind thereof may be used alone, or two or more kinds thereof may be used in combination. In a case where two or more kinds of cationic polymers are used in combination, a total content thereof is preferably within the above-mentioned range.

In the polishing liquid, the cationic polymer includes a first cationic polymer adsorbed on the ceria particles (hereinafter also referred to as "adsorbed component") and a second cationic polymer not adsorbed on the ceria particles (hereinafter also referred to as "free component").

The lower limit value of a mass content ratio of the adsorbed component to the free component (mass of adsorbed component/mass of free component) is preferably 0.001 or more and more preferably 0.50 or more from the viewpoint that generation of defects on a polishing target surface can then be further inhibited. The upper limit value of a mass content ratio of the adsorbed component to the free component is preferably 1.00 or less from the viewpoint that generation of defects on a polishing target surface can then be further inhibited.

A content of the adsorbed component and a content of the free component in the polishing liquid can be measured by the following methods.

The polishing liquid is subjected to ultracentrifugation, and components contained in the supernatant in the liquid after ultracentrifugation and a content thereof are identified by a gas chromatography (GC/MS) method or a liquid chromatography (LC/MS) method. Accordingly, a content of the free component is obtained. A content of the adsorbed component can be obtained by subtracting the content of the above-mentioned free component from a total mass of the cationic polymer contained in the polishing liquid (a total amount of the cationic polymer added).

Optional Components

The polishing liquid of the second embodiment may further contain optional components in addition to the above-mentioned components. Examples of optional components include a nitrogen-containing heterocyclic ring compound, 4-pyrone, a surfactant, a specific acid, hexametaphosphoric acid, and the like.

Nitrogen-Containing Heterocyclic Ring Compound and 4-Pyrone

The polishing liquid of the second embodiment preferably contains at least one selected from the group consisting of a nitrogen-containing heterocyclic ring compound and 4-pyrone.

The nitrogen-containing heterocyclic ring compound means a compound containing a heterocyclic ring containing one or more nitrogen atoms. The term "nitrogen-containing heterocyclic ring compound" referred to herein does not include a cationic polymer. In a case where the polishing liquid contains a nitrogen-containing heterocyclic ring compound, a polishing speed for $SiO_2$ and a polishing speed for SiN are both higher.

The number of nitrogen atoms contained in a heterocyclic ring of the nitrogen-containing heterocyclic ring compound is preferably 2 or more and is more preferably 2 to 4 from the viewpoint that a polishing speed for $SiO_2$ and a polishing speed for SiN are then both higher.

The nitrogen-containing heterocyclic ring compound may contain a heteroatom other than nitrogen (for example, an oxygen atom) in the heterocyclic ring thereof. The nitrogen-containing heterocyclic ring contained in the nitrogen-containing heterocyclic ring compound is preferably a 5- to 6-membered ring and is more preferably a 5-membered ring.

In addition, a molecular weight of the nitrogen-containing heterocyclic ring compound is preferably less than 1,000.

Examples of nitrogen-containing heterocyclic ring compounds include compounds having an imidazole skeleton, a pyrazole skeleton, a triazole skeleton, a tetrazole skeleton, a thiadiazole skeleton, or an oxadiazole skeleton, and a compound having an imidazole skeleton is preferable from the viewpoint that a polishing speed for $SiO_2$ and a polishing speed for SiN are then both higher.

Furthermore, the nitrogen-containing heterocyclic ring compound may be a compound having a polycyclic structure having a fused ring, and specific examples thereof include compounds having a purine skeleton, an indazole skeleton, a benzimidazole skeleton, a benzothiadiazole skeleton, or a naphthimidazole skeleton.

Specific examples of nitrogen-containing heterocyclic ring compounds include histidine, imidazole, 4-imidazolecarboxylic acid, 5-methylbenzotriazole, 5-aminobenzotriazole, benzotriazole, 5,6-dimethylbenzotriazole, 3-amino-1,2,4-triazole, 1,2,4-triazole, 3,5-dimethylpyrazole, and pyrazole. Among them, histidine, imidazole, and 4-imidazolecarboxylic acid, which are compounds having an imidazole skeleton, are preferable from the viewpoint that a polishing speed for $SiO_2$ and a polishing speed for SiN are then both higher.

A content of the nitrogen-containing heterocyclic ring compound is preferably 0.001% to 1% by mass and more preferably 0.01% to 0.5% by mass with respect to a total mass of the polishing liquid, from the viewpoint that a polishing speed for $SiO_2$ and a polishing speed for SiN are then both higher.

As the nitrogen-containing heterocyclic ring compound, one kind thereof may be used alone, or two or more kinds thereof may be used in combination. In a case where two or more kinds of nitrogen-containing heterocyclic ring compounds are used in combination, a total content thereof is preferably within the above-mentioned range.

A content of 4-pyrone is preferably 0.001% to 1% by mass, is more preferably 0.01% to 0.1% by mass, and is particularly preferably 0.05% to 1% by mass with respect to a total mass of the polishing liquid.

A content of hexametaphosphoric acid is preferably 0.001% to 1% by mass, more preferably 0.01% to 1% by mass, and particularly preferably 0.05% to 1% by mass with respect to a total mass of the polishing liquid.

Surfactant

The polishing liquid of the second embodiment may contain a surfactant.

The surfactant is not particularly limited, but an ionic surfactant (a anionic surfactant or a cationic surfactant) is preferably contained from the viewpoint that selectivity of polishing SiN with respect to polysilicon (hereinafter, also referred to as "poly-Si") can be increased.

Specific examples of anionic surfactants include carboxylic acid salts, sulfonic acid salts such as alkylbenzene sulfonic acid, sulfuric acid ester salts, phosphoric acid ester salts, and the like.

A content of the anionic surfactant is preferably 0.0001% to 1.0% by mass and is more preferably 0.001% to 0.5% by mass with respect to a total mass of the polishing liquid.

As the anionic surfactant, one kind thereof may be used alone, or two or more kinds thereof may be used in combination. In a case where two or more kinds of anionic surfactants are used in combination, a total content thereof is preferably within the above-mentioned range.

Specific examples of cationic surfactants include aliphatic amine salts, aliphatic quaternary ammonium salts, benzalkonium chloride salts, benzethonium chloride, pyridinium salts, imidazolinium salts, and the like.

A content of the cationic surfactant is preferably 0.0001% to 1% by mass and is more preferably 0.001% to 0.5% by mass with respect to a total mass of the polishing liquid.

As the cationic surfactant, one kind thereof may be used alone, or two or more kinds thereof may be used in combination. In a case where two or more kinds of cationic surfactants are used in combination, a total content thereof is preferably within the above-mentioned range.

Among the ionic surfactants, it is preferable to incorporate an anionic surfactant from the viewpoint that polishing selectivity of SiN with respect to poly-Si can then be increased.

That is, because a surface of poly-Si is hydrophobic, hydrophobic groups of a surfactant is disposed on a surface side of poly-Si, and hydrophilic groups of the surfactant is disposed on a side opposite to the surface side (a side away from the surface of poly-Si). Since the ceria particles in the polishing liquid are cationic, they are easily attracted to a hydrophilic group (anionic group) of the surfactant. It is considered that this decreases a polishing speed for poly-Si. It is considered that as a result, selectivity of polishing of SiN with respect to poly-Si is increased.

Furthermore, in a case where the polishing liquid contains an anionic surfactant, it is possible to further inhibit defects on a polishing target surface.

Specific Acid

The polishing liquid of the second embodiment may contain an inorganic acid and an organic acid (specific acids) containing at least one group selected from the group consisting of a carboxylic acid group, a phosphoric acid group, a phosphonic acid group, and a sulfonic acid group. The specific acids may function as a pH adjuster.

The specific acids are the same as the specific acid contained in the above-described polishing liquid of the first embodiment, and the same applies to preferable aspects thereof.

Ratio of Polishing Speed

In a case where the polishing liquid is used for polishing SiN, $SiO_2$, and their derivatives, a ratio of a polishing speed for SiN and its derivatives to a polishing speed for $SiO_2$ and its derivatives is preferably 0.25 to 4.0.

A ratio of a polishing speed for SiN and derivatives thereof to a polishing speed for $SiO_2$ and derivatives thereof means a ratio of a polishing speed of SiN to a polishing speed of $SiO_2$, a ratio of a polishing speed of SiN to a polishing speed of derivatives of $SiO_2$, a ratio of a polishing speed of derivatives of SiN to a polishing speed of $SiO_2$, and a ratio of a polishing speed of derivatives of SiN to a polishing speed of derivatives of $SiO_2$.

Specific examples of derivatives of $SiO_2$ include SiOC and $SiO_2$ that has been subjected to a doping treatment.

Specific examples of derivatives of SiN include SiON and SiN that has been subjected to a doping treatment.

In a case where the polishing liquid is used to polish SiN, poly-Si, and derivatives thereof, a ratio of a polishing speed for SiN and its derivative to a polishing speed for poly-Si and its derivative is more preferably 0.25 to 500.

A ratio of a polishing speed for SiN and derivatives thereof to a polishing speed for poly-Si and derivatives thereof means a ratio of a polishing speed of SiN to a polishing speed of poly-Si, a ratio of a polishing speed of SiN to a polishing speed of derivatives of poly-Si, a ratio of a polishing speed of derivatives of SiN to a polishing speed of poly-Si, and a ratio of a polishing speed of derivatives of SiN to a polishing speed of derivatives of poly-Si.

Specific examples of derivatives of poly-Si include poly-Si (modified polysilicon) that has been subjected to a doping treatment, and the like.

PH

The pH of the polishing liquid of the second embodiment is 3 to 8, and it is preferably 3 to 6 and is more preferably 3 to 4 from the viewpoint that defects can then be further inhibited to be generated on a polishing target surface.

The pH of the polishing liquid can be measured with a pH meter, and a measurement temperature is 25° C. As the pH meter, it is possible to use product name. "LAQUA series" (manufactured by HORIBA, Ltd.).

A method of adjusting a pH within the above-mentioned range is not limited to this, and examples thereof include a method of adding the above-mentioned specific acid.

Chemical Mechanical Polishing Method

A chemical mechanical polishing method of the embodiment of the present invention (hereinafter, also referred to as a "CMP method") includes a step of bringing a polishing target surface of a polishing target object into contact with a polishing pad while supplying the above-described polishing liquids of the first embodiment and the second embodiment (hereinafter abbreviated as "polishing liquids") to the polishing pad attached to a polishing platen, relatively moving the polishing target object and the polishing pad to polish the polishing target surface, and obtaining a polished polishing target object.

Polishing Target Object

The polishing target object preferably contains SiN and $SiO_2$, and more preferably further contains poly-Si.

Specific examples of polishing target objects include a substrate, and a laminate having a SiN layer and a $SiO_2$, layer on the substrate. A poly-Si layer may be further disposed on the substrate of the laminate. Each of the layers may be disposed in a thickness direction, or may be disposed in a direction intersecting the thickness direction.

According to the CMP method, the SiN layer, the $SiO_2$ layer, and the poly-Si layer are polished.

Specific examples of substrates include a single-layered semiconductor substrate and a multi-layered semiconductor substrate.

Specific examples of materials forming the single-layered semiconductor substrate include silicon, silicon germanium, a group III-V compound such as GaAs, or any combination thereof.

Specific example of multi-layered semiconductor substrates include a substrate in which an exposed integrated circuit structure such as interconnect features such as metal wires and dielectric materials is disposed on the above-mentioned semiconductor substrate such as silicon.

Polishing Device

A known chemical mechanical polishing device (hereinafter, also referred to as a "CMP device") can be used as a polishing device that can perform the CMP method.

Examples of CMP devices include a general CMP device having a holder for holding a polishing target object having a polishing target surface, and a polishing platen to which a polishing pad is attached (to which a motor or the like of which a rotation speed can be changed is attached). Examples of commercially available products of the CMP device include Reflexion (manufactured by Applied Materials, Inc.).

Polishing Pressure

A polishing pressure in the CMP method is preferably 3,000 to 25,000 Pa and is more preferably 6,500 to 14,000 Pa. The polishing pressure means a pressure generated on a contact surface between a polishing target surface and a polishing pad.

Rotation Speed for Polishing Platen

The rotation speed for a polishing platen in the CMP method is preferably 50 to 200 rpm and is more preferably 60 to 150 rpm.

In order to relatively move a polishing target object and the polishing pad, the holder may be rotated and/or rocked, the polishing platen may be rotated by planetary rotation, or a belt-shaped polishing pad may be moved linearly in one of longitudinal directions. In addition, the holder may be in any state of being fixed, rotating, or rocked. These polishing methods can be appropriately selected depending on polishing target surfaces and/or polishing devices as long as a polishing target object and the polishing pad are relatively moved.

Method of Supplying Polishing Liquid

In the CMP method, it is preferable to continuously supply the present polishing liquid to the polishing pad on the polishing platen by a pump or the like while polishing a polishing target surface. Although a supply amount of the present polishing liquid is not limited, it is preferable that a surface of the polishing pad be always covered with the present polishing liquid.

Method for Producing Polishing Liquid

A method for producing a polishing liquid of the present invention includes Step X and Step Y (one of Step Y1 or Step Y2).

(Step X) A step of obtaining ceria particles by a method for producing ceria particles including Step A, Step B, and Step C.

(Step Y1) A step of mixing the ceria particles obtained in Step X, the above-described anionic polymer, and the above-described specific acid, and adjusting a pH to 3 to 8.

(Step Y2) A step of mixing the ceria particles obtained in Step X and the above-described cationic polymer and adjusting a pH to 3 to 8.

In Step X, the method for producing ceria particles including Step A, Step B, and Step C is as described above.

In Step Y1 and Step Y2, the order of adding each component is not particularly limited. Examples of aspects of Step Y1 include an aspect in which a specific acid is added to a dispersion liquid of the ceria particles obtained in Step X to adjust a pH to 3 to 8 and then an anionic polymer is further added. Examples of aspects of Step Y2 include an aspect in which a pH of a dispersion liquid of the ceria particles obtained in Step X is adjusted to 3 to 8 and then a cationic polymer is further added.

Furthermore, Step Y1 may be, for example, a step of mixing each of the above-mentioned components to a predetermined concentration, and thereby obtaining the polishing liquid of the first embodiment. Alternatively, the polishing liquid of the first embodiment may be obtained by preparing a concentrated liquid of the polishing liquid in Step Y1 and performing a diluting step to be performed after Step Y1. Furthermore, Step Y2 may be, for example, a step of mixing each of the above-mentioned components to a predetermined concentration, and thereby obtaining the polishing liquid of the second embodiment. Alternatively, the polishing liquid of the second embodiment may be obtained by preparing a concentrated liquid of the polishing liquid in Step Y2 and performing a diluting step to be performed after Step Y2.

EXAMPLES

Hereinafter, the present invention will be described in more detail based on examples. In the following Examples, materials to be used, amounts and ratios thereof, the details of the treatment, the treatment procedures, and the like may be suitably modified without departing from the scope of the present invention. Accordingly, the scope of the present invention should not be limitedly interpreted by the following examples.

Production of Ceria Particles

Production of Particle 0

Step A

Ceria particles were produced according to the following procedure based on components and blending amounts shown in Table 1.

Commercially available cerium raw materials were dispersed in pure water and then stirred at 200 rpm, and thereby a dispersion liquid (cerium dispersion liquid) was obtained. A polycarboxylic acid was added to this dispersion liquid, and then the mixture was stirred for 15 minutes. Furthermore, an alkaline earth metal salt was added thereto, and then the mixture was stirred for 30 minutes.

Next, the dispersion liquid containing the alkaline earth metal salt was dried at 60° C., and thereby a white powder was obtained.

Step B

This powder was put in an alumina container and baked in air at 800° C. for 1 hour, and thereby a white to yellowish white powder was obtained.

Step C 100 g of the obtained powder was dispersed in an aqueous solution of nitric acid (which was adjusted to a concentration shown in Table 1). Thereafter, an alkaline earth metal oxide was dissolved by an ultrasonic disperser, and thereby a ceria dispersion liquid was obtained. The ultrasonic dispersion was performed at an ultrasonic frequency of 400 kHz for 90 minutes as a dispersion time.

The obtained ceria dispersion liquid was further centrifuged to remove the supernatant and dried at 60° C., and thereby a powder was obtained. Phase identification of this powder was performed by X-ray diffraction, and it was confirmed that the powder was ceria (cerium oxide).

Measurement of Average Primary Particle Size

An average primary particle size of the ceria particles in the obtained ceria dispersion liquid was obtained by measuring particle sizes (equivalent circle diameters) of 1,000 primary particles arbitrarily selected from an image captured using a transmission electron microscope TEM2010 (pressurization voltage: 200 kV) manufactured by JEOL Ltd., and arithmetically averaging the values. An equivalent circle diameter was as described above. Table 1 shows the evaluation results.

Measurement of Aspect Ratio

An average aspect ratio of the ceria particles was obtained by measuring a major axis and a minor axis for every arbitrary 100 particles observed with the above-mentioned transmission electron microscope, calculating aspect ratios (major axis/minor axis) of the respective particles, and arithmetically averaging the aspect ratios of the 100 particles. A major axis of the particles was as described above. Table 1 shows the evaluation results.

Measurement of Median Diameter

Median diameters (D10, D50, and D90) of the ceria particles in the obtained ceria dispersion liquid were evaluated using a particle size distribution measurement device (SALD-7500nano, manufactured by Shimadzu Corporation). Table 1 shows the evaluation results.

Measurement of Surface Metal Species

A surface metal species on surfaces of the obtained ceria particles was measured by the following procedure.

First, ceria particles were mixed with gelatin, and the obtained mixture was applied in a paste form on a Si substrate (film thickness of a coating film: 1 μm). Next, the obtained coating film was dried at high temperature, and then gelatin was sintered from the substrate.

Using Thermo Scientific™ K-Alpha™ system, ESCA measurement was performed on the obtained sample to evaluate each atom concentration (where each atom concentration was obtained as an average value obtained by arithmetically averaging each atom concentration obtained in 10 regions of the sample measured by ESCA). Furthermore, binding energy of each element after the measurement was evaluated, and thereby a ratio of metal elements and oxide elements could be measured from the existing ratio. Furthermore, from the above-mentioned measurement results, a mass content ratio of cerium atoms to the alkaline earth metal atoms on the surfaces of the ceria particles could be calculated.

Production of Particles 1 to 12

Particles 1 to 12 were produced and evaluated in the same manner as in the particle 0 except that the components and blending amounts shown in Table 1 were changed.

Table 1 is shown below.

In Table 1, "Mass content ratio (cerium atoms/alkaline earth metal atoms)" means a mass content ratio of cerium atoms to alkaline earth metal atoms on surfaces of ceria particles.

TABLE 1

| | Step of producing ceria articles | | | | | | | | | | | |
|---|---|---|---|---|---|---|---|---|---|---|---|---|
| | Step A | | | | | | | | | | Step B | |
| | Cerium raw material | | Pure water | Polyacrylic acid | | Stirring speed/time | | Alkaline earth metal | | Drying temperature for | Baking conditions | |
| Table 1 | Type | Content (kg) | Content (kg) | Content (kg) | Weight-average molecular weight | rpm | Time (min) | Type | Content (kg) | dispersion liquid (° C.) | Temperature (° C.) | Time (h) |
| Particle 0 | Cerium oxy-carbonate | 0.7 | 9.4 | 0.01 | 8000 | 200 | 30 | Calcium nitrate | 0.06 | 60 | 800 | 1 |
| Particle 1 | Cerium oxy-carbonate | 0.7 | 9.4 | 0.01 | 8000 | 3000 | 30 | Calcium nitrate | 0.06 | 60 | 800 | 1 |
| Particle 2 | Cerium oxy-carbonate | 0.7 | 9.4 | 0.01 | 8000 | 1500 | 30 | Cal cium nitrate | 0.06 | 60 | 1000 | 3 |
| Particle 3 | Cerium oxy-carbonate | 0.7 | 9.4 | 0.2 | 25000 | 1500 | 30 | Strontium nitrate | 0.06 | 60 | 800 | 1 |
| Particle 4 | Cerium oxy-carbonate | 0.7 | 9.4 | 0.01 | 25000 | 3000 | 30 | Calcium nitrate | 0.06 | 60 | 1000 | 2 |
| Particle 5 | Cerium carbonate | 1.0 | 9.0 | 0.2 | 8000 | 2000 | 30 | Calcium nitrate | 0.06 | 60 | 800 | 0.5 |
| Particle 6 | Cerium carbonate | 1.0 | 9.0 | 0.01 | 2500 | 2000 | 30 | Calcium nitrate | 0.06 | 60 | 800 | 1 |
| Particle 7 | Cerium oxy-carbonate | 0.7 | 9.4 | 0.01 | 8000 | 2000 | 30 | Calcium nitrate | 0.15 | 60 | 800 | 1 |

TABLE 1-continued

| | | | | | | | | | | | | |
|---|---|---|---|---|---|---|---|---|---|---|---|---|
| Particle 8 | Cerium oxy-carbonate | 0.7 | 9.4 | 0.01 | 8000 | 3000 | 30 | Cal-cium nitrate | 0.15 | 60 | 800 | 1 |
| Particle 9 | Cerium oxy-carbonate | 0.7 | 9.4 | 0.01 | 8000 | 3000 | 30 | Cal-cium nitrate | 0.01 | 60 | 800 | 1 |
| Particle 10 | Cerium oxy-carbonate | 0.7 | 9.4 | 0.01 | 8000 | 3000 | 30 | Cal-cium nitrate | 0.001 | 60 | 800 | 1 |
| Particle 11 | Cerium oxy-carbonate | 0.7 | 9.4 | 0.01 | 8000 | 3000 | 30 | Cal-cium nitrate | 1 | 60 | 800 | 1 |
| Particle 12 | Cerium oxy-carbonate | 0.7 | 9.4 | 0.01 | 8000 | 3000 | 30 | Cal-cium nitrate | 5 | 60 | 800 | 1 |

| | Step of producing ceria articles | | Characteristics of ceria particles | | | | | | |
|---|---|---|---|---|---|---|---|---|---|
| | Step C Aqueous solution of nitric acid | | | | | | | | |
| Table 1 | Concen-tration (% by mass) | Amount used (kg) | Average primary particle size (nm) | Aspect ratio | D10 (nm) | D50 (nm) | D90 (nm) | Surface metal species | Mass content ratio (Cerium atom/alkaline earth metal atom) |
| Particle 0 | 0.05 | 20 | 470 | 8.0 | 200 | 400 | 520 | Ce, Ca, and oxides thereof | 10 |
| Particle 1 | 0.05 | 20 | 5 | 9.0 | 2 | 5 | 10 | Ce, Ca, and oxides thereof | 55 |
| Particle 2 | 0.05 | 20 | 8 | 8.0 | 5 | 8 | 13 | Ce, Ca, and oxides thereof | 20 |
| Particle 3 | 0.01 | 20 | 7 | 7.0 | 4 | 7 | 12 | Ce, Sr, and oxides thereof | 28 |
| Particle 4 | 0.05 | 20 | 6 | 8.0 | 3 | 6 | 11 | Ce, Ca, and oxides thereof | 40 |
| Particle 5 | 0.05 | 20 | 10 | 8.0 | 7 | 10 | 15 | Ce, Ca, and oxides thereof | 15 |
| Particle 6 | 0.01 | 20 | 8 | 6.0 | 5 | 8 | 13 | Ce, Ca, and oxides thereof | 20 |
| Particle 7 | 0.05 | 20 | 5 | 9.0 | 3 | 6 | 12 | Ce, Ca, and oxides thereof | 4 |
| Particle 8 | 0.05 | 20 | 5 | 9.0 | 3 | 5 | 8 | Ce, Ca, and oxides thereof | 6 |
| Particle 9 | 0.05 | 20 | 5 | 9.0 | 2 | 6 | 11 | Ce, Ca, and oxides thereof | 95 |
| Particle 10 | 0.05 | 20 | 5 | 9.0 | 1 | 3 | 8 | Ce, Ca, and oxides thereof | 131 |
| Particle 11 | 0.05 | 20 | 5 | 9.0 | 1 | 4 | 9 | Ce, Ca, and oxides thereof | 6 |
| Particle 12 | 0.05 | 20 | 5 | 9.0 | 2 | 6 | 11 | Ce, Ca, and oxides thereof | 5 |

Preparation of Each Polishing Liquid of Examples 1A to 65A and Comparative Examples 1A to 3A Components shown in Table 2 were respectively mixed to prepare polishing liquids of each of Examples and Comparative Examples.

The outline of the components shown in Table 2 is shown below.

Various Components

Ceria Particles

The particles 0 to 12 obtained by the above-described method for producing ceria particles were used.

Specific Acid

Acetic acid (corresponding to an organic acid containing a carboxy group)

Malic acid (corresponding to an organic acid containing a carboxy group)

Phosphoric acid (corresponding to an inorganic acid containing a phosphoric acid group)

PTSA (p-toluenesulfonic acid (corresponding to an organic acid containing a sulfonic acid group))

Glycine (corresponding to an organic acid containing a carboxy group)

Oxalic acid (corresponding to an organic acid containing a carboxy group)

1-Hydroxyethane-1,1-diphosphonic acid (corresponding to an organic acid containing a phosphonic acid group))

2-Pyridinecarboxylic acid (corresponding to an organic acid containing a carboxy group)

Anionic Polymer

PAA (polyacrylic acid)

PMA (polymethacrylic acid)

PAA-PMA (copolymer containing polymethacrylic acid and polymethacrylic acid)

In addition, a numerical value in the column of "Anionic polymer" in the table means a weight-average molecular weight.

Nitrogen-Containing Heterocyclic Ring Compound or 4-Pyrone

2-Methylimidazole (corresponding to a nitrogen-containing heterocyclic ring compound)

Imidazole (corresponds to a nitrogen-containing heterocyclic ring compound)

4-pyrone

Surfactant

DBSA (dodecylbenzene sulfonic acid (corresponding to an anionic surfactant))

Takesurf-A43-N (product name, manufactured by TAKEMOTO OIL & FAT Co., Ltd. (corresponding to an anionic surfactant))

Cetyltrimethylammonium chloride (corresponding to a cationic surfactant)

Cetylpyridinium chloride (corresponding to a cationic surfactant)

Water

Water (pure water)

Various Measurements

PH

A pH of the polishing liquid at 25° C. was measured using a pH meter (product name "LAQUA series," manufactured by HORIBA, Ltd.). Table 2 shows the measurement results.

Measurement of Content of Alkaline Earth Metal Atoms

Regarding the ceria particles to be used, a content of alkaline earth metal atoms was measured with respect to a total mass of the ceria particles. Specifically, the measurement was carried out by an ICP-MS method (measuring apparatus: Agilent 8800) using the solid of the ceria particles obtained by the above-mentioned method for producing ceria particles. Table 2 shows the measurement results.

Evaluation Test of Each Polishing Liquid of Examples 1A to 65A and Comparative Examples 1A to 3A Polishing Speed Calculation of polishing speed: blanket wafers of SiN, $SiO_2$, and poly-Si were respectively polished for 60 seconds, a film thickness difference between before and after polishing was obtained for 49 evenly-spaced locations on wafer surfaces, and a value obtained by dividing the film thickness difference by the polishing time was defined as a polishing speed (unit: nm/min). Table 1 shows the results.

Polishing device: Reflexion (manufactured by Applied Materials, Inc.)

Polishing pad: IC1010 (manufactured by Rodel)

Polishing conditions:

Polishing pressure (contact pressure between a polishing target surface and a polishing pad): 1.5 psi (in the present specification, psi means pound-force per square inch, and 1 psi=6894.76 Pa)

Supply rate of polishing liquid: 200 ml/min

Rotation speed for polishing platen: 110 rpm

Rotation speed for polishing head: 100 rpm

Selection Ratio

From the polishing speed of each of the wafers calculated as described above, a ratio of the polishing speed for $SiO_2$ to the polishing speed for SiN (selection ratio ($SiO_2$/SiN)) and a ratio of the polishing speed for $SiO_2$ to the polishing speed for poly-Si (selection ratio ($SiO_2$/poly-Si)) were respectively obtained. Table 2 shows the results.

Defects

In the same manner as in the above polishing speed calculation, the blanket wafer of SiN which had been polished for 60 seconds was evaluated for defects (scratches) on a polishing target surface thereof by Surfscan SP2 (product name, manufactured by KLA, a defect inspection device). Table 2 shows the results.

A: The number of defects after polishing is 20 or less

B: The number of defects after polishing is 21 to 30

C: The number of defects after polishing is 31 to 50

D: The number of defects after polishing is 51 to 60

F: The number of defects after polishing is 61 or more

Table 2 is shown below.

In Table 2, "Content of alkaline earth metal atoms (mass ppt)" means a content of alkaline earth metal atoms with respect to a total mass of the ceria particles.

In addition, in the table, "A<" (where A represents a numerical value) means that a value is larger than A, and "<A" means that a value is smaller than A.

TABLE 2

| | Composition of polishing liquid | | | | | | | | | | | |
|---|---|---|---|---|---|---|---|---|---|---|---|---|
| | Ceria particle | | Specific acid | | Anionic polymer | | | Characteristics of particle | | | Other additive | |
| Table 2 | Type | Content | Type | Content | Type and weight-average molecular weight | Content | Mass content ratio (adsorbed component/free component) | D10 (nm) | D50 (nm) | D90 (nm) | Type | Content |
| Example 1A | Particle 0 | 1.5% | Acetic acid | 0.3% | PAA 8000 | 1% | 0.05 | 200 | 400 | 520 | — | — |
| Example 2A | Particle 1 | 1.5% | Acetic acid | 0.3% | PAA 8000 | 1% | 0.04 | 2 | 5 | 10 | — | — |
| Example 3A | Particle 1 | 1.5% | Acetic acid | 0.3% | PAA 8000 | 1% | 0.04 | 2 | 5 | 10 | — | — |

TABLE 2-continued

| | | | | | | | | | | | | |
|---|---|---|---|---|---|---|---|---|---|---|---|---|
| Example 4A | Particle 1 | 1.5% | Acetic acid | 0.3% | PAA 8000 | 1% | 0.04 | 2 | 5 | 10 | — | — |
| Example 5A | Particle 1 | 1.5% | Acetic acid | 0.3% | PAA 8000 | 1% | 0.04 | 2 | 5 | 10 | — | — |
| Example 6A | Particle 1 | 1.5% | Acetic acid | 0.3% | PAA 8000 | 1% | 0.04 | 2 | 5 | 10 | — | — |
| Example 7A | Particle 1 | 1.5% | Acetic acid | 0.3% | PAA 8000 | 1% | 0.04 | 5 | 8 | 13 | — | — |
| Example 8A | Particle 1 | 1.5% | Acetic acid | 0.3% | PAA 8000 | 1% | 0.04 | 2 | 5 | 10 | Hexameta-phos-phoric acid | 0.2% |
| Example 9A | Particle 2 | 1.5% | Acetic acid | 0.3% | PAA 8000 | 1% | 0.04 | 5 | 8 | 13 | — | — |
| Example 10A | Particle 3 | 1.5% | Acetic acid | 0.3% | PAA 8000 | 1% | 0.04 | 4 | 7 | 12 | — | — |
| Example 11A | Particle 4 | 1.5% | Acetic acid | 0.3% | PAA 8000 | 1% | 0.04 | 3 | 6 | 11 | — | — |
| Example 12A | Particle 5 | 1.5% | Acetic acid | 0.3% | PAA 8000 | 1% | 0.04 | 7 | 10 | 15 | — | — |
| Example 12A | Particle 6 | 1.5% | Acetic acid | 0.3% | PAA 8000 | 1% | 0.04 | 5 | 8 | 13 | — | — |
| Example 13A | Particle 7 | 1.5% | Acetic acid | 0.3% | PAA 8000 | 1% | 0.04 | 3 | 6 | 12 | — | — |
| Example 14A | Particle 8 | 1.5% | Acetic acid | 0.3% | PAA 8000 | 1% | 0.04 | 3 | 5 | 8 | — | — |
| Example 15A | Particle 9 | 1.5% | Acetic acid | 0.3% | PAA 8000 | 1% | 0.04 | 2 | 6 | 11 | — | — |
| Example 16A | Particle 10 | 1.5% | Acetic acid | 0.3% | PAA 8000 | 1% | 0.04 | 1 | 3 | 8 | — | — |
| Example 17A | Particle 11 | 1.5% | Acetic acid | 0.3% | PAA 8000 | 1% | 0.04 | 1 | 4 | 9 | — | — |
| Example 18A | Particle 12 | 1.5% | Acetic acid | 0.3% | PAA 8000 | 1% | 0.04 | 2 | 6 | 11 | — | — |

| | Composition of polishing liquid | | | Evaluation results | | | | | |
|---|---|---|---|---|---|---|---|---|---|
| Table 2 | Water Content (%) | Alkaline earth metal atom Content (mass ppt) | pH | Polishing speed for $SiO_2$ (nm/min) | Polishing speed for SiN (nm/min) | Polishing speed for poly-Si (nm/min) | Selection ratio $SiO_2$/SiN | Selection ratio $SiO_2$/poly-Si | Evalua-tion of defect |
| Example 1A | Residue | 150 | 5 | 512 | 11 | — | 46.5 | — | C |
| Example 2A | Residue | 120 | 3 | 385 | 6 | — | 64.2 | — | B |
| Example 3A | Residue | 118 | 4 | 415 | 6 | — | 70.3 | — | A |
| Example 4A | Residue | 116 | 5 | 432 | 6 | 32 | 73.2 | 13.5 | A |
| Example 5A | Residue | 114 | 6 | 410 | 6 | — | 69.5 | — | A |
| Example 6A | Residue | 113 | 7 | 398 | 6 | — | 66.9 | — | B |
| Example 7A | Residue | 111 | 8 | 365 | 6 | — | 61.9 | — | B |
| Example 8A | Residue | 118 | 5 | 486 | 3 | — | 162.0 | — | A |
| Example 9A | Residue | 110 | 5 | 435 | 6 | — | 73.2 | — | A |
| Example 10A | Residue | 108 | 5 | 453 | 6 | — | 76.9 | — | A |
| Example 11A | Residue | 121 | 5 | 442 | 7 | — | 65.8 | — | A |
| Example 12A | Residue | 126 | 5 | 441 | 6 | — | 70.6 | — | A |
| Example 12A | Residue | 132 | 5 | 439 | 6 | — | 69.8 | — | A |
| Example 13A | Residue | 106 | 5 | 264 | 15 | — | 17.6 | — | D |
| Example 14A | Residue | 125 | 5 | 316 | 10 | — | 31.6 | — | C |
| Example 15A | Residue | 9 | 5 | 251 | 13 | — | 19.3 | — | C |
| Example 16A | Residue | 21 | 5 | 363 | 11 | — | 33.0 | — | B |
| Example 17A | Residue | 1352 | 5 | 342 | 6 | — | 57.0 | — | B |
| Example 18A | Residue | 10652 | 5 | 269 | 2 | — | 134.5 | — | C |

TABLE 3

| Table 2 (continued below) | Composition of polishing liquid: Ceria particle Type | Ceria particle Content | Specific acid Type | Specific acid Content | Anionic polymer: Type and weight-average molecular weight | Anionic polymer: Content | Anionic polymer: Mass content ratio (adsorbed component/free component) | Characteristics of particle D10 (nm) | D50 (nm) | D90 (nm) | Other additive Type | Other additive Content |
|---|---|---|---|---|---|---|---|---|---|---|---|---|
| Example 19A | Particle 1 | 1.0% | Acetic acid | 0.3% | PAA 8000 | 1% | 0.04 | 2 | 5 | 10 | — | — |
| Example 20A | Particle 1 | 2.0% | Acetic acid | 0.3% | PAA 8000 | 1% | 0.03 | 2 | 5 | 10 | — | — |
| Example 21A | Particle 1 | 3.0% | Acetic acid | 0.3% | PAA 8000 | 1% | 0.05 | 2 | 5 | 10 | — | — |
| Example 22A | Particle 1 | 5.0% | Acetic acid | 0.3% | PAA 8000 | 1% | 0.08 | 2 | 5 | 10 | — | — |
| Example 23A | Particle 1 | 1.5% | Acetic acid | 1% | PAA 8000 | 1% | 0.13 | 2 | 5 | 10 | — | — |
| Example 24A | Particle 1 | 1.5% | Acetic acid | 3% | PAA 8000 | 1% | 0.04 | 2 | 5 | 10 | — | — |
| Example 25A | Particle 1 | 1.5% | Acetic acid | 0.03% | PAA 8000 | 1% | 0.04 | 2 | 5 | 10 | — | — |
| Example 26A | Particle 1 | 1.5% | Acetic acid | 0.01% | PAA 8000 | 1% | 0.04 | 2 | 5 | 10 | — | — |
| Example 27A | Particle 1 | 1.5% | Acetic acid | 1% | PAA 8000 | 5% | 1.50 | 2 | 5 | 10 | — | — |
| Example 28A | Particle 1 | 1.5% | Acetic acid | 3% | PAA 8000 | 2% | 0.30 | 2 | 5 | 10 | — | — |
| Example 29A | Particle 1 | 1.5% | Acetic acid | 0.03% | PAA 8000 | 0.1% | 0.001 | 2 | 5 | 10 | — | — |
| Example 30A | Particle 1 | 1.5% | Acetic acid | 0.01% | PAA 8000 | 0.005% | 0.0005 | 2 | 5 | 10 | — | — |

| Table 2 (continued below) | Composition of polishing liquid: Water Content (%) | Alkaline earth metal atom Content (mass ppt) | pH | Evaluation results: Polishing speed for $SiO_2$ (nm/min) | Polishing speed for SiN (nm/min) | Polishing speed for poly-Si (nm/min) | Selection ratio $SiO_2$/SiN | Selection ratio $SiO_2$/poly-Si | Evaluation of defect |
|---|---|---|---|---|---|---|---|---|---|
| Example 19A | Residue | 86 | 5 | 402 | 4 | — | 102.8 | — | A |
| Example 20A | Residue | 168 | 5 | 525 | 12 | — | 44.8 | — | A |
| Example 21A | Residue | 352 | 5 | 565 | 13 | — | 44.9 | — | A |
| Example 22A | Residue | 658 | 5 | 642 | 11 | — | 57.2 | — | A |
| Example 23A | Residue | 112 | 5 | 424 | 1 | — | 415.2 | — | A |
| Example 24A | Residue | 121 | 5 | 433 | 6 | — | 66.8 | — | A |
| Example 25A | Residue | 165 | 5 | 477 | 8 | — | 58.3 | — | A |
| Example 26A | Residue | 121 | 5 | 433 | 4 | — | 98.4 | — | A |
| Example 27A | Residue | 118 | 5 | 430 | 6 | — | 73.5 | — | B |
| Example 28A | Residue | 132 | 5 | 444 | 1 | — | 444.0 | — | A |
| Example 29A | Residue | 135 | 5 | 447 | 8 | — | 55.9 | — | A |
| Example 30A | Residue | 165 | 5 | 477 | 11 | — | 43.4 | — | C |

TABLE 4

| Table 2 (continued below) | Composition of polishing liquid | | | | | | | | | | | |
|---|---|---|---|---|---|---|---|---|---|---|---|---|
| | Ceria particle | | Specific acid | | Anionic polymer | | | Characteristics of particle | | | Other additive | |
| | Type | Content | Type | Content | Type and weight-average molecular weight | Content | Mass content ratio (adsorbed component/free component) | D10 (nm) | D50 (nm) | D90 (nm) | Type | Content |
| Example 31A | Particle 1 + Particle 2 (1:1) | 1.5% | Acetic acid | 0.3% | PAA 8000 | 1% | 0.04 | — | — | — | — | — |
| Example 32A | Particle 1 + Particle 3 (1:1) | 1.5% | Acetic acid | 0.3% | PAA 8000 | 1% | 0.04 | — | — | — | — | — |
| Example 33A | Particle 1 + Particle 4 (1:1) | 1.5% | Acetic acid | 0.3% | PAA 8000 | 1% | 0.04 | — | — | — | — | — |
| Example 34A | Particle 1 + Particle 5 (1:1) | 1.5% | Acetic acid | 0.3% | PAA 8000 | 1% | 0.04 | — | — | — | — | — |
| Example 35A | Particle 1 + Particle 6 (1:1) | 1.5% | Acetic acid | 0.3% | PAA 8000 | 1% | 0.04 | — | — | — | — | — |
| Example 36A | Particle 2 + Particle 3 (1:1) | 1.5% | Acetic acid | 0.3% | PAA 8000 | 1% | 0.04 | — | — | — | — | — |
| Example 37A | Particle 2 + Particle 4 (1:1) | 1.5% | Acetic acid | 0.3% | PAA 8000 | 1% | 0.04 | — | — | — | — | — |
| Example 38A | Particle 2 + Particle 5 (1:1) | 1.5% | Acetic acid | 0.3% | PAA 8000 | 1% | 0.04 | — | — | — | — | — |
| Example 39A | Particle 2 + Particle 6 (1:1) | 1.5% | Acetic acid | 0.3% | PAA 8000 | 1% | 0.04 | — | — | — | — | — |
| Example 40A | Particle 3 + Particle 4 (1:1) | 1.5% | Acetic acid | 0.3% | PAA 8000 | 1% | 0.04 | — | — | — | — | — |
| Example 41A | Particle 3 + Particle 5 (1:1) | 1.5% | Acetic acid | 0.3% | PAA 8000 | 1% | 0.04 | — | — | — | — | — |
| Example 42A | Particle 3 + Particle 6 (1:1) | 1.5% | Acetic acid | 0.3% | PAA 8000 | 1% | 0.04 | — | — | — | — | — |
| Example 43A | Particle 4 + Particle 5 (1:1) | 1.5% | Acetic acid | 0.3% | PAA 8000 | 1% | 0.04 | — | — | — | — | — |
| Example 44A | Particle 4 + Particle 6 (1:1) | 1.5% | Acetic acid | 0.3% | PAA 8000 | 1% | 0.04 | — | — | — | — | — |
| Example 45A | Particle 5 + Particle 6 (1:1) | 1.5% | Acetic acid | 0.3% | PAA 8000 | 1% | 0.04 | — | — | — | — | — |

TABLE 4-continued

| Table 2 (continued below) | Composition of polishing liquid: Water Content (%) | Composition of polishing liquid: Alkaline earth metal atom Content (mass ppt) | pH | Evaluation results: Polishing speed for $SiO_2$ (nm/min) | Polishing speed for SiN (nm/min) | Polishing speed for poly-Si (nm/min) | Selection ratio $SiO_2$/SiN | Selection ratio $SiO_2$/poly-Si | Evaluation of defect |
|---|---|---|---|---|---|---|---|---|---|
| Example 31A | Residue | 163 | 5 | 475 | 5 | — | 94.9 | — | A |
| Example 32A | Residue | 130 | 5 | 442 | 5 | — | 92.1 | — | A |
| Example 33A | Residue | 128 | 5 | 440 | 6 | — | 74.5 | — | A |
| Example 34A | Residue | 126 | 5 | 438 | 6 | — | 74.2 | — | A |
| Example 35A | Residue | 124 | 5 | 436 | 6 | — | 73.9 | — | A |
| Example 36A | Residue | 122 | 5 | 434 | 6 | — | 73.0 | — | A |
| Example 37A | Residue | 120 | 5 | 432 | 6 | — | 73.3 | — | A |
| Example 38A | Residue | 119 | 5 | 431 | 6 | — | 72.5 | — | A |
| Example 39A | Residue | 117 | 5 | 429 | 6 | — | 72.8 | — | A |
| Example 40A | Residue | 131 | 5 | 443 | 7 | — | 65.9 | — | A |
| Example 41A | Residue | 137 | 5 | 449 | 6 | — | 71.8 | — | A |
| Example 42A | Residue | 143 | 5 | 455 | 6 | — | 72.4 | — | A |
| Example 43A | Residue | 93 | 5 | 405 | 4 | — | 103.6 | — | A |
| Example 44A | Residue | 182 | 5 | 494 | 5 | — | 98.8 | — | A |
| Example 45A | Residue | 189 | 5 | 501 | 5 | — | 100.2 | — | A |

TABLE 5

| Table 2 (continued below) | Composition of polishing liquid: Ceria particle Type | Ceria particle Content | Specific acid Type | Specific acid Content | Anionic polymer: Type and weight-average molecular weight | Anionic polymer: Content | Anionic polymer: Mass content ratio (adsorbed component/free component) | Characteristics of particle: D10 (nm) | D50 (nm) | D90 (nm) | Other additive Type | Other additive Content |
|---|---|---|---|---|---|---|---|---|---|---|---|---|
| Example 46A | Particle 1 | 1.5% | Malic acid | 0.3% | PAA 8000 | 1% | 0.04 | 2 | 5 | 10 | — | — |
| Example 47A | Particle 1 | 1.5% | Phosphoric acid | 0.3% | PAA 8000 | 1% | 0.04 | 2 | 5 | 10 | — | — |
| Example 48A | Particle 1 | 1.5% | pTSA | 0.3% | PAA 8000 | 1% | 0.04 | 2 | 5 | 10 | — | — |
| Example 49A | Particle 1 | 1.5% | Glycine | 0.3% | PAA 8000 | 1% | 0.04 | 2 | 5 | 10 | — | — |
| Example 50A | Particle 1 | 1.5% | Oxalic acid | 0.3% | PAA 8000 | 1% | 0.04 | 2 | 5 | 10 | — | — |
| Example 51A | Particle 1 | 1.5% | 1-Hydroxyethane-1,1-diphosphonic acid | 0.3% | PAA 8000 | 1% | 0.04 | 2 | 5 | 10 | — | — |
| Example 52A | Particle 1 | 1.5% | 2-Pyridinecarboxylic acid | 0.3% | PAA 8000 | 1% | 0.04 | 2 | 5 | 10 | — | — |
| Example 53A | Particle 1 | 1.5% | Acetic acid | 0.3% | PAA 8000 | 1% | 0.04 | 2 | 5 | 10 | — | — |
| Example 54A | Particle 1 | 1.5% | Acetic acid | 0.3% | PAA 25000 | 1% | 0.04 | 2 | 5 | 10 | — | — |
| Example 55A | Particle 1 | 1.5% | Acetic acid | 0.3% | PAA 5000 | 1% | 0.04 | 2 | 5 | 10 | — | — |
| Example 56A | Particle 1 | 1.5% | Acetic acid | 0.3% | PAA 8000 | 1% | 0.04 | 2 | 5 | 10 | — | — |

TABLE 5-continued

| | | | | | | | | | | | | |
|---|---|---|---|---|---|---|---|---|---|---|---|---|
| Example 57A | Particle 1 | 1.5% | Acetic acid | 0.3% | PAA-PMA 8000 | 1% | 0.04 | 2 | 5 | 10 | — | — |
| Example 58A | Particle 1 | 1.5% | Acetic acid | 0.3% | PAA-PMA 25000 | 1% | 0.04 | 2 | 5 | 10 | — | — |

| Table 2 (continued below) | Composition of polishing liquid Water Content (%) | Composition of polishing liquid Alkaline earth metal atom Content (mass ppt) | pH | Evaluation results Polishing speed for $SiO_2$ (nm/min) | Polishing speed for SiN (nm/min) | Polishing speed for poly-Si (nm/min) | Selection ratio $SiO_2$/SiN | Selection ratio $SiO_2$/poly-Si | Evaluation of defect |
|---|---|---|---|---|---|---|---|---|---|
| Example 46A | Residue | 156 | 5 | 468 | 5 | — | 93.6 | — | A |
| Example 47A | Residue | 121 | 5 | 433 | 5 | — | 86.7 | — | A |
| Example 48A | Residue | 131 | 5 | 443 | 5 | — | 88.6 | — | A |
| Example 49A | Residue | 179 | 5 | 491 | 5 | — | 98.2 | — | A |
| Example 50A | Residue | 131 | 5 | 443 | 5 | — | 88.6 | — | A |
| Example 51A | Residue | 128 | 5 | 440 | 5 | — | 88.0 | — | A |
| Example 52A | Residue | 143 | 5 | 455 | 5 | — | 91.0 | — | A |
| Example 53A | Residue | 146 | 5 | 458 | 6 | — | 76.4 | — | A |
| Example 54A | Residue | 179 | 5 | 491 | 3 | — | 163.6 | — | A |
| Example 55A | Residue | 176 | 5 | 488 | 5 | — | 97.6 | — | A |
| Example 56A | Residue | 141 | 5 | 453 | 7 | — | 64.7 | — | A |
| Example 57A | Residue | 138 | 5 | 450 | 4 | — | 112.6 | — | A |
| Example 58A | Residue | 136 | 5 | 448 | 1 | — | 448.1 | — | A |

TABLE 6

| Table 2 | Composition of polishing liquid | | | | | | | | | | | |
|---|---|---|---|---|---|---|---|---|---|---|---|---|
| | Ceria particle | | Specific acid | | Anionic polymer | | | Characteristics of particle | | | Other additive | |
| | | | | | Type and weight-average | | Mass content ratio (adsorbed component/ | | | | | |
| (continued below) | Type | Content | Type | Content | molecular weight | Content | free component) | D10 (nm) | D50 (nm) | D90 (nm) | Type | Content |
| Example 59A | Particle 1 | 1.5% | Acetic acid | 0.3% | PAA 8000 | 1% | 0.04 | 2 | 5 | 10 | 2-Methyl-limidazole | 0.1% |
| Example 60A | Particle 1 | 1.5% | Acetic acid | 0.3% | PAA 8000 | 1% | 0.04 | 2 | 5 | 10 | Imidazole | 0.1% |
| Example 61A | Particle 1 | 1.5% | Acetic acid | 0.3% | PAA 8000 | 1% | 0.04 | 2 | 5 | 10 | 4-Pyrone | 0.1% |
| Example 62A | Particle 1 | 1.5% | Acetic acid | 0.3% | PAA 8000 | 1% | 0.04 | 2 | 5 | 10 | DBSA | 0.01% |
| Example 63A | Particle 1 | 1.5% | Acetic acid | 0.3% | PAA 8000 | 1% | 0.04 | 2 | 5 | 10 | Takesurf-A43-N | 0.01% |
| Example 64A | Particle 1 | 1.5% | Acetic acid | 0.3% | PAA 8000 | 1% | 0.04 | 2 | 5 | 10 | Cetyltri-methyl-ammonium chloride | 0.01% |
| Example 65A | Particle 1 | 1.5% | Acetic acid | 0.3% | PAA 8000 | 1% | 0.04 | 2 | 5 | 10 | Cetyl-pyridinium chloride | 0.01% |
| Comparative Example 1A | Particle 1 | 1.5% | Acetic acid | 0.3% | | | <5 | 2 | 5 | 10 | — | — |
| Comparative Example 2A | Particle 1 | 1.5% | Acetic acid | 0.3% | PAA 8000 | 1% | 1580 | 2 | 5 | 10 | — | — |

TABLE 6-continued

| | | | | | | | | | | | | |
|---|---|---|---|---|---|---|---|---|---|---|---|---|
| Comparative Example 3A | Particle 1 | 1.5% | Acetic acid | 0.3% | PAA 8000 | 1% | 1546 | 2 | 5 | 10 | — | — |

| Table 2 (continued below) | Composition of polishing liquid | | | Evaluation results | | | | | |
|---|---|---|---|---|---|---|---|---|---|
| | Water Content (%) | Alkaline earth metal atom Content (mass ppt) | pH | Polishing speed for $SiO_2$ (nm/min) | Polishing speed for SiN (nm/min) | Polishing speed for poly-Si (nm/min) | Selection ratio $SiO_2$/SiN | Selection ratio $SiO_2$/poly-Si | Evaluation of defect |
| Example 59A | Residue | 134 | 5 | 495 | 6 | — | 83.9 | — | A |
| Example 60A | Residue | 133 | 5 | 485 | 6 | — | 81.5 | — | A |
| Example 61A | Residue | 130 | 5 | 512 | 6 | — | 86.9 | — | A |
| Example 62A | Residue | 129 | 5 | 441 | 6 | 6 | 74.2 | 73.5 | A |
| Example 63A | Residue | 127 | 5 | 439 | 6 | 2 | 74.5 | 219.4 | A |
| Example 64A | Residue | 142 | 5 | 454 | 7 | 5 | 67.5 | 90.8 | B |
| Example 65A | Residue | 148 | 5 | 460 | 6 | 4 | 73.6 | 115.0 | B |
| Comparative Example 1A | Residue | 155 | 5 | 415 | 25 | — | 16.60 | — | E |
| Comparative Example 2A | Residue | 101 | 2 | 265 | 18 | — | 14.72 | — | E |
| Comparative Example 3A | Residue | 197 | 9 | 135 | 3 | — | 45.00 | — | E |

Based on the results shown in Table 2, it was clarified that, according to the polishing liquids of the examples, defects were less likely to be generated on a polishing target surface, and a ratio of a polishing speed for $SiO_2$ to a polishing speed for SiN (selection ratio ($SiO_2$/SiN)) was high.

Furthermore, based on comparison between Example 1A and Example 4A, it was confirmed that defects on a polishing target surface were further less likely to be generated and a selection ratio ($SiO_2$/SiN) was higher in a case where a median diameter of ceria particles was small (specifically, in a case where D10 was 10 nm or less, D50 was 15 nm or less, and D90 was 20 nm or less). Example 1A corresponds to an aspect in which a stirring speed is 200 rpm during production of ceria particles, and Example 4A corresponds to an aspect in which a stirring speed is 500 to 5,000 rpm during production of ceria particles.

Furthermore, based on comparison between Examples 2A to 7A, it was confirmed that defects on a polishing target surface were further less likely to be generated and a selection ratio ($SiO_2$/SiN) was higher in a case where a pH of the polishing liquid was 4 to 6.

Furthermore, based on comparison between Example 4A and Example 8A, it was confirmed that a selection ratio ($SiO_2$/SiN) was higher in a case where the polishing liquid contained a hexametaphosphoric acid.

Furthermore, based on comparison between Example 4A and Example 13A, it was confirmed that defects on a polishing target surface were further less likely to be generated and a selection ratio ($SiO_2$/SiN) was higher in a case where a mass content ratio of cerium atoms to alkaline earth metal atoms on surfaces of the ceria particles was 5 or more.

Furthermore, based on comparison between Example 4A and Examples 15A to 18A, it was confirmed that defects were further less likely to be generated on a polishing target surface in a case where a content of alkaline earth metal atoms was 10 mass ppt to 10 mass ppb with respect to a total mass of the ceria particles. Furthermore, based on comparison between Example 4A and Example 9A to Example 18A, it was confirmed that defects on a polishing target surface were further less likely to be generated and a selection ratio ($SiO_2$/SiN) was higher in a case where a content of alkaline earth metal atoms was 10 mass ppt to 10 mass ppb with respect to a total mass of the ceria particles, and a mass content ratio of cerium atoms to alkaline earth metal atoms was 10 to 100.

Furthermore, based on comparison between Example 4A and Examples 19A to 22A, it was confirmed that a selection ratio ($SiO_2$/SiN) was higher in a case where a content of ceria particles was 1.8% by mass or less (preferably 1.2% by mass or less) with respect to a total mass of the polishing liquid.

Furthermore, based on comparison between Example 4A and Examples 23A to 26A, it was confirmed that a selection ratio ($SiO_2$/SiN) was higher in a case where a content of the specific acid was 0.1% to 1.2% by mass with respect to a total mass of the polishing liquid.

Furthermore, based on comparison between Example 4A and Examples 27A to 30A, it was confirmed that a selection ratio ($SiO_2$/SiN) was higher in a case where a content of the anionic polymer was 0.2% to 5% by mass (preferably 1.5% to 4% by mass) with respect to a total mass of the polishing liquid. Furthermore, based on comparison between Example 4A and Examples 27A to 30A, it was confirmed that defects on a polishing target surface were further less likely to be generated in a case where a ratio of a mass of the first anionic polymer (adsorbed component) to a mass of the second anionic polymer (free component) was 0.001 to 1.00.

Furthermore, based on comparison between Example 4A and Examples 53A to 58A, it was confirmed that a selection ratio ($SiO_2$/SiN) was higher in a case where a weight-average molecular weight of the anionic polymer was 15,000 or more.

Furthermore, based on comparison between Example 4A and Examples 59A to 61A, it was confirmed that a selection ratio ($SiO_2$/SiN) was higher in a case where the polishing liquid contained a nitrogen-containing heterocyclic ring compound or 4-pyrone.

Furthermore, based on comparison between Example 4A and Examples 62A to 65A, it was confirmed that defects on a polishing target surface were further less likely to be generated in a case where the polishing liquid contained an anionic surfactant.

Based on the results in Table 2, it was clarified that the polishing liquids of the comparative examples did not meet the desired requirements.

Preparation of Each Polishing Liquid of Examples 1B to 65B and Comparative Examples 1B to 3B Components shown in Table 3 were respectively mixed to prepare polishing liquids of each of Examples and Comparative Examples.

The outline of the components shown in Table 3 is shown below.

Various Components

Ceria Particles

The particles 0 to 12 obtained by the above-described method for producing ceria particles were used.

Specific Acid

Acetic acid (corresponding to an organic acid containing a carboxy group)

Malic acid (corresponding to an organic acid containing a carboxy group)

Phosphoric acid (corresponding to an inorganic acid containing a phosphoric acid group)

PTSA (p-toluenesulfonic acid (corresponding to an organic acid containing a sulfonic acid group))

Glycine (corresponding to an organic acid containing a carboxy group)

Oxalic acid (corresponding to an organic acid containing a carboxy group)

1-Hydroxyethane-1,1-diphosphonic acid (corresponding to an organic acid containing a phosphoric acid group))

2-Pyridinecarboxylic acid (corresponding to an organic acid containing a carboxy group)

Cationic Polymer

PMMA (poly(trimethylaminoethyl-methacrylate methylsulfate), (corresponding to a polymer having a side chain including a monovalent ammonium salt structure represented by General Formula (1)))

Cationized POVAL ("Kuraray C polymer," product name (corresponding to a polymer having a side chain including a cationic group))

Copolymer of DAPAA (dimethylaminopropylacrylamide) (corresponding to a polymer having a side chain including a cationic group))

Copolymer of DADMA (diallyldimethylammonium chloride) (corresponding to a polymer having a side chain including a cationic group))

PEI (polyethylimine hydrochloride (corresponding to a polymer having a cationic group in a main chain))

In addition, a numerical value in the column of "Cationic polymer" in the table means a weight-average molecular weight.

Nitrogen-Containing Heterocyclic Ring Compound or 4-Pyrone

2-Methylimidazole (corresponding to a nitrogen-containing heterocyclic ring compound)

Imidazole (corresponds to a nitrogen-containing heterocyclic ring compound)

4-pyrone

Surfactant

DBSA (dodecylbenzene sulfonic acid (corresponding to an anionic surfactant))

Takesurf-A43-N (product name, manufactured by TAKEMOTO OIL & FAT Co., Ltd. (corresponding to an anionic surfactant))

Cetyltrimethylammonium chloride (corresponding to a cationic surfactant)

Cetylpyridinium chloride (corresponding to a cationic surfactant)

Water

Water (pure water)

Various Measurements

PH

A pH of the polishing liquid at 25° C. was measured using a pH meter (product name "LAQUA series," manufactured by HORIBA, Ltd.). Table 3 shows the measurement results.

Measurement of Content of Alkaline Earth Metal Atoms

Regarding the ceria particles to be used, a content of alkaline earth metal atoms was measured with respect to a total mass of the ceria particles. Specifically, the measurement was carried out by an ICP-MS method (measuring apparatus: Agilent 8900) using the solid of the ceria particles obtained by the above-mentioned method for producing ceria particles. Table 3 shows the measurement results.

Evaluation Test of Each Polishing Liquid of Examples 1B to 65B and Comparative Examples 1B to 3B

Polishing Speed

Calculation of polishing speed: blanket wafers of SiN, $SiO_2$, and poly-Si were respectively polished for 60 seconds, a film thickness difference between before and after polishing was obtained for 49 evenly-spaced locations on wafer surfaces, and a value obtained by dividing the film thickness difference by the polishing time was defined as a polishing speed (unit: nm/min). Table 1 shows the results.

Polishing device: Reflexion (manufactured by Applied Materials, Inc.)

Polishing pad: IC1010 (manufactured by Rodel)

Polishing conditions:

Polishing pressure (contact pressure between a polishing target surface and a polishing pad): 1.5 psi (in the present specification, psi means pound-force per square inch, and 1 psi=6894.76 Pa)

Supply rate of polishing liquid: 200 ml/min

Rotation speed for polishing platen: 110 rpm

Rotation speed for polishing head: 100 rpm

Selection Ratio

From the polishing speed of each of the wafers calculated as described above, a ratio of the polishing speed for SiN to the polishing speed for $SiO_2$_(selection ratio $SiN/SiO_2$)) and a ratio of the polishing speed for SiN to the polishing speed for poly-Si (selection ratio (SiN/poly-Si)) were respectively obtained. Table 3 shows the results.

Defects

In the same manner as in the above polishing speed calculation, the blanket wafer of SiN which had been polished for 60 seconds was evaluated for defects (scratches) on a polishing target surface thereof by Surfscan SP2 (product name, manufactured by KLA, a defect inspection device). Table 3 shows the results.

A: The number of defects after polishing is 20 or less

B: The number of defects after polishing is 21 to 30

C: The number of defects after polishing is 31 to 50

D: The number of defects after polishing is 51 to 60

F: The number of defects after polishing is 61 or more

Table 3 is shown below

In Table 3, “Content of alkaline earth metal atoms (mass ppt)” means a content of alkaline earth metal atoms with respect to a total mass of the ceria panicles.

In addition, in the table, “A<” (where A represents a numerical value) means that a value is larger than A, and “<A” means that a value is smaller than A.

TABLE 7

| | Composition of polishing liquid | | | | | | | | | | | |
|---|---|---|---|---|---|---|---|---|---|---|---|---|
| | Ceria particle | | Specific acid | | Cationic polymer | | Mass content ratio (adsorbed component/free component | Characteristics of particle | | | Other additive | |
| Table 3 | Type | Content | Type | Content | Type and weight-average molecular weight | Content | | D10 (nm) | D50 (nm) | D90 (nm) | Type | Content |
| Example 1B | Particle 1 | 1.5% | Acetic acid | 0.3% | PMMA 10000 | 1% | 1.00 | 200 | 400 | 520 | — | — |
| Example 2B | Particle 1 | 1.5% | Acetic acid | 0.3% | PMMA 10000 | 1% | 0.80 | 2 | 5 | 10 | — | — |
| Example 3B | Particle 1 | 1.5% | Acetic acid | 0.3% | PMMA 10000 | 1% | 0.70 | 2 | 5 | 10 | — | — |
| Example 4B | Particle 1 | 1.5% | Acetic acid | 0.3% | PMMA 10000 | 1% | 0.70 | 2 | 5 | 10 | — | — |
| Example 5B | Particle 1 | 1.5% | Acetic acid | 0.3% | PMMA 10000 | 1% | 0.60 | 2 | 5 | 10 | — | — |
| Example 6B | Particle 1 | 1.5% | Acetic acid | 0.3% | PMMA 10000 | 1% | 0.60 | 2 | 5 | 10 | — | — |
| Example 7B | Particle 1 | 1.5% | Acetic acid | 0.3% | PMMA 10000 | 1% | 0.50 | 5 | 8 | 13 | — | — |
| Example 8B | Particle 2 | 1.5% | Acetic acid | 0.3% | PMMA 10000 | 1% | 0.70 | 5 | 8 | 13 | — | — |
| Example 9B | Particle 3 | 1.5% | Acetic acid | 0.3% | PMMA 10000 | 1% | 0.60 | 4 | 7 | 12 | — | — |
| Example 10B | Particle 4 | 1.5% | Acetic acid | 0.3% | PMMA 10000 | 1% | 0.70 | 3 | 6 | 11 | — | — |
| Example 11B | Particle 5 | 1.5% | Acetic acid | 0.3% | PMMA 10000 | 1% | 0.80 | 7 | 10 | 15 | — | — |
| Example 12B | Particle 6 | 1.5% | Acetic acid | 0.3% | PMMA 10000 | 1% | 0.60 | 5 | 8 | 13 | — | — |
| Example 13B | Particle 7 | 1.5% | Acetic acid | 0.3% | PMMA 10000 | 1% | 0.50 | 3 | 6 | 12 | — | — |
| Example 14B | Particle 8 | 1.5% | Acetic acid | 0.3% | PMMA 10000 | 1% | 0.40 | 3 | 5 | 8 | — | — |
| Example 15B | Particle 9 | 1.5% | Acetic acid | 0.3% | PMMA 10000 | 1% | 0.50 | 2 | 6 | 11 | — | — |
| Example 16B | Particle 10 | 1.5% | Acetic acid | 0.3% | PMMA 10000 | 1% | 0.60 | 1 | 3 | 8 | — | — |
| Example 17B | Particle 11 | 1.5% | Acetic acid | 0.3% | PMMA 10000 | 1% | 0.30 | 1 | 4 | 9 | — | — |
| Example 18B | Particle 12 | 1.5% | Acetic acid | 0.3% | PMMA 10000 | 1% | 0.40 | 2 | 6 | 11 | — | — |

| | Composition of polishing liquid | | | Evaluation results | | | | | |
|---|---|---|---|---|---|---|---|---|---|
| Table 3 | Water Content (%) | Alkaline earth metal atom Content (mass ppt) | pH | Polishing speed for SiN (nm/min) | Polishing speed for $SiO_2$ (nm/min) | Polishing speed for poly-Si (nm/min) | Selection ratio SiN/$SiO_2$ | Selection ratio SiN/Poly-Si | Evaluation of defect |
| Example 1B | Residue | 113 | 5 | 507 | 200 | — | 2.5 | — | C |
| Example 2B | Residue | 90 | 3 | 408 | 144 | — | 2.8 | — | A |
| Example 3B | Residue | 89 | 4 | 475 | 15 | 28 | 3.0 | 12.6 | A |
| Example 4B | Residue | 87 | 5 | 465 | 165 | — | 2.8 | — | B |

TABLE 7-continued

| | | | | | | | | | |
|---|---|---|---|---|---|---|---|---|---|
| Example 5B | Residue | 86 | 6 | 435 | 155 | — | 2.8 | — | B |
| Example 6B | Residue | 85 | 7 | 421 | 150 | — | 2.8 | — | C |
| Example 7B | Residue | 83 | 8 | 418 | 136 | — | 3.1 | — | C |
| Example 8B | Residue | 83 | 4 | 492 | 166 | — | 3.0 | — | A |
| Example 9B | Residue | 81 | 4 | 507 | 174 | — | 2.9 | — | A |
| Example 10B | Residue | 91 | 4 | 498 | 169 | — | 2.9 | — | A |
| Example 11B | Residue | 95 | 4 | 497 | 169 | — | 2.9 | — | A |
| Example 12B | Residue | 99 | 4 | 495 | 168 | — | 2.9 | — | A |
| Example 13B | Residue | 106 | 4 | 315 | 218 | — | 1.4 | — | D |
| Example 14B | Residue | 125 | 4 | 365 | 195 | — | 1.9 | — | C |
| Example 15B | Residue | 9 | 4 | 458 | 232 | — | 2.0 | — | C |
| Example 16B | Residue | 21 | 4 | 411 | 145 | — | 2.8 | — | B |
| Example 17B | Residue | 1352 | 4 | 458 | 156 | — | 2.9 | — | B |
| Example 18B | Residue | 10652 | 4 | 428 | 191 | — | 2.2 | — | C |

TABLE 8

| Table 3 (continued below) | Composition of polishing liquid | | | | | | | | | | | |
|---|---|---|---|---|---|---|---|---|---|---|---|---|
| | Ceria particle | | Specific acid | | Cationic polymer | | Mass content ratio (adsorbed component/ free component | Characteristics of particle | | | Other additive | |
| | Type | Con-tent | Type | Content | Type and weight-average molecular weight | Con-tent | | D10 (nm) | D50 (nm) | D90 (nm) | Type | Con-tent |
| Example 19B | Particle 1 | 1.0% | Acetic acid | 0.3% | PMMA 10000 | 1% | 0.80 | 2 | 5 | 10 | — | — |
| Example 20B | Particle 1 | 2.0% | Acetic acid | 0.3% | PMMA 10000 | 1% | 0.60 | 2 | 5 | 10 | — | — |
| Example 21B | Particle 1 | 3.0% | Acetic acid | 0.3% | PMMA 10000 | 1% | 0.50 | 2 | 5 | 10 | — | — |
| Example 22B | Particle 1 | 5.0% | Acetic acid | 0.3% | PMMA 10000 | 1% | 0.20 | 2 | 5 | 10 | — | — |
| Example 23B | Particle 1 | 1.5% | Acetic acid | 1% | PMMA 10000 | 1% | 0.70 | 2 | 5 | 10 | — | — |
| Example 24B | Particle 1 | 1.5% | Acetic acid | 3% | PMMA 10000 | 1% | 0.70 | 2 | 5 | 10 | — | — |
| Example 25B | Particle 1 | 1.5% | Acetic acid | 0.03% | PMMA 10000 | 1% | 0.70 | 2 | 5 | 10 | — | — |
| Example 26B | Particle 1 | 1.5% | Acetic acid | 0.01% | PMMA 10000 | 1% | 0.70 | 2 | 5 | 10 | — | — |
| Example 27B | Particle 1 | 1.5% | Acetic acid | 1% | PMMA 10000 | 3% | 1.50 | 2 | 5 | 10 | — | — |
| Example 28B | Particle 1 | 1.5% | Acetic acid | 3% | PMMA 10000 | 0.3% | 0.60 | 2 | 5 | 10 | — | — |
| Example 29B | Particle 1 | 1.5% | Acetic acid | 0.03% | PMMA 10000 | 0.1% | 0.40 | 2 | 5 | 10 | — | — |
| Example 30B | Particle 1 | 1.5% | Acetic acid | 0.01% | PMMA 10000 | 0.05% | 0.0005 | 2 | 5 | 10 | — | — |

TABLE 8-continued

| Table 3 (continued below) | Composition of polishing liquid: Water Content (%) | Composition of polishing liquid: Alkaline earth metal atom Content (mass ppt) | pH | Evaluation results: Polishing speed for SiN (nm/min) | Evaluation results: Polishing speed for $SiO_2$ (nm/min) | Evaluation results: Polishing speed for poly-Si (nm/min) | Evaluation results: Selection ratio $SiN/SiO_2$ | Evaluation results: Selection ratio SiN/ Poly-Si | Evaluation results: Evaluation of defect |
|---|---|---|---|---|---|---|---|---|---|
| Example 19B | Residue | 65 | 4 | 464 | 152 | — | 3.1 | — | A |
| Example 20B | Residue | 126 | 4 | 568 | 206 | — | 2.8 | — | A |
| Example 21B | Residue | 264 | 4 | 602 | 224 | — | 2.7 | — | A |
| Example 22B | Residue | 494 | 4 | 668 | 257 | — | 2.6 | — | A |
| Example 23B | Residue | 84 | 4 | 483 | 162 | — | 3.0 | — | A |
| Example 24B | Residue | 91 | 4 | 490 | 166 | — | 3.0 | — | A |
| Example 25B | Residue | 124 | 4 | 528 | 185 | — | 2.9 | — | A |
| Example 26B | Residue | 91 | 4 | 490 | 166 | — | 3.0 | — | A |
| Example 27B | Residue | 89 | 4 | 488 | 164 | — | 3.0 | — | C |
| Example 28B | Residue | 99 | 4 | 500 | 170 | — | 2.9 | — | A |
| Example 29B | Residue | 101 | 4 | 502 | 172 | — | 2.9 | — | B |
| Example 30B | Residue | 124 | 4 | 528 | 185 | — | 2.9 | — | D |

TABLE 9

| Table 3 (continued below) | Composition of polishing liquid: Ceria particle Type | Ceria particle Content | Specific acid Type | Specific acid Content | Cationic polymer Type and weight-average molecular weight | Cationic polymer Content | Mass content ratio (adsorbed component/ free component | Characteristics of particle D10 (nm) | Characteristics of particle D50 (nm) | Characteristics of particle D90 (nm) | Other additive Type | Other additive Content |
|---|---|---|---|---|---|---|---|---|---|---|---|---|
| Example 31B | Particle 1 + Particle 2 (1:1) | 1.5% | Acetic acid | 0.3% | PMMA 10000 | 1% | 0.70 | — | — | — | — | — |
| Example 32B | Particle 1 + Particle 3 (1:1) | 1.5% | Acetic acid | 0.3% | PMMA 10000 | 1% | 0.70 | — | — | — | — | — |
| Example 33B | Particle 1 + Particle 4 (1:1) | 1.5% | Acetic acid | 0.3% | PMMA 10000 | 1% | 0.70 | — | — | — | — | — |
| Example 34B | Particle 1 + Particle 5 (1:1) | 1.5% | Acetic acid | 0.3% | PMMA 10000 | 1% | 0.70 | — | — | — | — | — |
| Example 35B | Particle 1 + Particle 6 (1:1) | 1.5% | Acetic acid | 0.3% | PMMA 10000 | 1% | 0.70 | — | — | — | — | — |
| Example 36B | Particle 2 + Particle 3 (1:1) | 1.5% | Acetic acid | 0.3% | PMMA 10000 | 1% | 0.70 | — | — | — | — | — |
| Example 37B | Particle 2 + Particle 4 (1:1) | 1.5% | Acetic acid | 0.3% | PMMA 10000 | 1% | 0.70 | — | — | — | — | — |
| Example 38B | Particle 2 + Particle 5 (1:1) | 1.5% | Acetic acid | 0.3% | PMMA 10000 | 1% | 0.70 | — | — | — | — | — |
| Example 39B | Particle 2 + Particle 6 (1:1) | 1.5% | Acetic acid | 0.3% | PMMA 10000 | 1% | 0.70 | — | — | — | — | — |
| Example 40B | Particle 3 + Particle 4 (1:1) | 1.5% | Acetic acid | 0.3% | PMMA 10000 | 1% | 0.70 | — | — | — | — | — |

TABLE 9-continued

| | | | | | | | | | | | | |
|---|---|---|---|---|---|---|---|---|---|---|---|---|
| Example 41B | Particle 3 + Particle 5 (1:1) | 1.5% | Acetic acid | 0.3% | PMMA 10000 | 1% | 0.70 | — | — | — | — | — |
| Example 42B | Particle 3 + Particle 6 (1:1) | 1.5% | Acetic acid | 0.3% | PMMA 10000 | 1% | 0.70 | — | — | — | — | — |
| Example 43B | Particle 4 + Particle 5 (1:1) | 1.5% | Acetic acid | 0.3% | PMMA 10000 | 1% | 0.70 | — | — | — | — | — |
| Example 44B | Particle 4 + Particle 6 (1:1) | 1.5% | Acetic acid | 0.3% | PMMA 10000 | 1% | 0.70 | — | — | — | — | — |
| Example 45B | Particle 5 + Particle 6 (1:1) | 1.5% | Acetic acid | 0.3% | PMMA 10000 | 1% | 0.70 | — | — | — | — | — |

| | Composition of polishing liquid | | | Evaluation results | | | | | |
|---|---|---|---|---|---|---|---|---|---|
| Table 3 (continued below) | Water Content (%) | Alkaline earth metal atom Content (mass ppt) | pH | Polishing speed for SiN (nm/min) | Polishing speed for $SiO_2$ (nm/min) | Polishing speed for poly-Si (nm/min) | Selection ratio SiN/ $SiO_2$ | Selection ratio SiN/ Poly-Si | Evaluation of defect |
| Example 31B | Residue | 122 | 4 | 525 | 184 | — | 2.9 | — | A |
| Example 32B | Residue | 98 | 4 | 498 | 169 | — | 2.9 | — | A |
| Example 33B | Residue | 96 | 4 | 496 | 169 | — | 2.9 | — | A |
| Example 34B | Residue | 94 | 4 | 494 | 168 | — | 2.9 | — | A |
| Example 35B | Residue | 93 | 4 | 492 | 167 | — | 3.0 | — | A |
| Example 36B | Residue | 92 | 4 | 491 | 166 | — | 3.0 | — | A |
| Example 37B | Residue | 90 | 4 | 490 | 165 | — | 3.0 | — | A |
| Example 38B | Residue | 89 | 4 | 489 | 165 | — | 3.0 | — | A |
| Example 39B | Residue | 88 | 4 | 487 | 164 | — | 3.0 | — | A |
| Example 40B | Residue | 98 | 4 | 499 | 170 | — | 2.9 | — | A |
| Example 41B | Residue | 102 | 4 | 503 | 172 | — | 2.9 | — | A |
| Example 42B | Residue | 107 | 4 | 509 | 175 | — | 2.9 | — | A |
| Example 43B | Residue | 70 | 4 | 467 | 153 | — | 3.0 | — | A |
| Example 44B | Residue | 137 | 4 | 542 | 192 | — | 2.8 | — | A |
| Example 45B | Residue | 142 | 4 | 548 | 195 | — | 2.8 | — | A |

TABLE 10

| | Composition of polishing liquid | | | | | | | | | | | |
|---|---|---|---|---|---|---|---|---|---|---|---|---|
| | | | | | Cationic polymer | | Mass | | | | | |
| Table 3 | Ceria particle | | Specific acid | | Type and weight-average | | content ratio (adsorbed component/ | Characteristics of particle | | | Other additive | |
| (continued below) | Type | Con-tent | Type | Con-tent | molecular weight | Con-tent | free component | D10 (nm) | D50 (nm) | D90 (nm) | Type | Con-tent |
| Example 46B | Particle 1 | 1.5% | Malic acid | 0.3% | PMMA 10000 | 1% | 0.70 | 2 | 5 | 10 | — | — |
| Example 47B | Particle 1 | 1.5% | Phosphoric acid | 0.3% | PMMA 10000 | 1% | 0.70 | 2 | 5 | 10 | — | — |
| Example 48B | Particle 1 | 1.5% | pTSA | 0.3% | PMMA 10000 | 1% | 0.70 | 2 | 5 | 10 | — | — |
| Example 49B | Particle 1 | 1.5% | Glycine | 0.3% | PMMA 10000 | 1% | 0.70 | 2 | 5 | 10 | — | — |

TABLE 10-continued

| | | | | | | | | | | | | |
|---|---|---|---|---|---|---|---|---|---|---|---|---|
| Example 50B | Particle 1 | 1.5% | Oxalic acid | 0.3% | PMMA 10000 | 1% | 0.70 | 2 | 5 | 10 | — | — |
| Example 51B | Particle 1 | 1.5% | 1-Hydroxy-ethane-1,1-diphosphonic acid | 0.3% | PMMA 10000 | 1% | 0.70 | 2 | 5 | 10 | — | — |
| Example 52B | Particle 1 | 1.5% | 2-Pyridine-carboxylic acid | 0.3% | PMMA 10000 | 1% | 0.70 | 2 | 5 | 10 | — | — |
| Example 53B | Particle 1 | 1.5% | Acetic acid | 0.3% | PMMA 4000 | 1% | 0.70 | 2 | 5 | 10 | — | — |
| Example 54B | Particle 1 | 1.5% | Acetic acid | 0.3% | PMMA 30000 | 1% | 0.70 | 2 | 5 | 10 | — | — |
| Example 55B | Particle 1 | 1.5% | Acetic acid | 0.3% | Cationized POVAL 10000 | 1% | 0.70 | 2 | 5 | 10 | — | — |
| Example 56B | Particle 1 | 1.5% | Acetic acid | 0.3% | DAPAA 8000 | 1% | 0.70 | 2 | 5 | 10 | — | — |
| Example 57B | Particle 1 | 1.5% | Acetic acid | 0.3% | DADMA 8000 | 1% | 0.70 | 2 | 5 | 10 | — | — |
| Example 58B | Particle 1 | 1.5% | Acetic acid | 0.3% | PEI 10000 | 1% | 0.70 | 2 | 5 | 10 | — | — |

| | Composition of polishing liquid | | | Evaluation results | | | | | |
|---|---|---|---|---|---|---|---|---|---|
| Table 3 (continued below) | Water Content (%) | Alkaline earth metal atom Content (mass ppt) | pH | Polishing speed for SiN (nm/min) | Polishing speed for $SiO_2$ (nm/min) | Polishing speed for poly-Si (nm/min) | Selection ratio SiN/ $SiO_2$ | Selection ratio SiN/ Poly-Si | Evaluation of defect |
| Example 46B | Residue | 117 | 4 | 520 | 181 | — | 2.9 | — | A |
| Example 47B | Residue | 91 | 4 | 491 | 166 | — | 3.0 | — | A |
| Example 48B | Residue | 98 | 4 | 499 | 170 | — | 2.9 | — | A |
| Example 49B | Residue | 134 | 4 | 539 | 191 | — | 2.8 | — | A |
| Example 50B | Residue | 98 | 4 | 499 | 170 | — | 2.9 | — | A |
| Example 51B | Residue | 96 | 4 | 496 | 169 | — | 2.9 | — | A |
| Example 52B | Residue | 107 | 4 | 509 | 175 | — | 2.9 | — | A |
| Example 53B | Residue | 110 | 4 | 512 | 177 | — | 2.9 | — | A |
| Example 54B | Residue | 134 | 4 | 539 | 191 | — | 2.8 | — | A |
| Example 55B | Residue | 132 | 5 | 514 | 190 | — | 2.7 | — | A |
| Example 56B | Residue | 106 | 4 | 507 | 174 | — | 2.9 | — | A |
| Example 57B | Residue | 104 | 4 | 505 | 173 | — | 2.9 | — | A |
| Example 58B | Residue | 102 | 4 | 503 | 172 | — | 2.9 | — | A |

TABLE 11

| | Composition of polishing liquid | | | | | | | | | | | |
|---|---|---|---|---|---|---|---|---|---|---|---|---|
| | | | | | Cationic polymer | | Mass | | | | | |
| Table 3 | Ceria particle | | Specific acid | | Type and weight-average | | content ratio (adsorbed component/ | Characteristics of particle | | | Other additive | |
| (continued below) | Type | Content | Type | Content | molecular weight | Content | free component | D10 (nm) | D50 (nm) | D90 (nm) | Type | Content |
| Example 59B | Particle 1 | 1.5% | Acetic acid | 0.3% | PMMA 10000 | 1% | 0.70 | 2 | 5 | 10 | 2-Methyl-imidazole | 0.1% |
| Example 60B | Particle 1 | 1.5% | Acetic acid | 0.3% | PMMA 10000 | 1% | 0.70 | 2 | 5 | 10 | Imidazole | 0.1% |

TABLE 11-continued

| | | | | | | | | | | | | |
|---|---|---|---|---|---|---|---|---|---|---|---|---|
| Example 61B | Particle 1 | 1.5% | Acetic acid | 0.3% | PMMA 10000 | 1% | 0.70 | 2 | 5 | 10 | 4-Pyrone | 0.1% |
| Example 62B | Particle 1 | 1.5% | Acetic acid | 0.3% | PMMA 10000 | 1% | 0.70 | 2 | 5 | 10 | DBSA | 0.01% |
| Example 63B | Particle 1 | 1.5% | Acetic acid | 0.3% | PMMA 10000 | 1% | 0.70 | 2 | 5 | 10 | Takesur f-A43-N | 0.01% |
| Example 64B | Particle 1 | 1.5% | Acetic acid | 0.3% | PMMA 10000 | 1% | 0.70 | 2 | 5 | 10 | Cetyltri-methyl-ammonium chloride | 0.01% |
| Example 65B | Particle 1 | 1.5% | Acetic acid | 0.3% | PMMA 10000 | 1% | 0.70 | 2 | 5 | 10 | Cetyl-pyridinium chloride | 0.01% |
| Comparative Example 1B | Particle 1 | 1.5% | Acetic acid | 0.3% | | | <5 | 2 | 5 | 10 | — | — |
| Comparative Example 2B | Particle 1 | 1.5% | Acetic acid | 0.3% | PMMA 10000 | 1% | 1580 | 2 | 5 | 10 | — | — |
| Comparative Example 3B | Particle 1 | 1.5% | Acetic acid | 0.3% | PMMA 10000 | 1% | 1546 | 2 | 5 | 10 | — | — |

| | Composition of polishing liquid | | | Evaluation results | | | | | |
|---|---|---|---|---|---|---|---|---|---|
| Table 3 (continued below) | Water Content (%) | Alkaline earth metal atom Content (mass ppt) | pH | Polishing speed for SiN (nm/min) | Polishing speed for $SiO_2$ (nm/min) | Polishing speed for poly-Si (nm/min) | Selection ratio SiN/$SiO_2$ | Selection ratio SiN/Poly-Si | Evalua-tion of defect |
| Example 59B | Residue | 100 | 4 | 543 | 193 | — | 2.8 | — | A |
| Example 60B | Residue | 99 | 4 | 534 | 188 | — | 2.8 | — | A |
| Example 61B | Residue | 98 | 4 | 557 | 200 | — | 2.8 | — | A |
| Example 62B | Residue | 97 | 4 | 497 | 169 | 185 | 2.9 | 31.2 | A |
| Example 63B | Residue | 95 | 4 | 495 | 168 | 265 | 2.9 | 124.0 | A |
| Example 64B | Residue | 107 | 4 | 508 | 175 | 13 | 2.9 | 3.7 | B |
| Example 65B | Residue | 111 | 4 | 513 | 177 | 18 | 2.9 | 4.9 | B |
| Comparative Example 1B | Residue | 116 | 4 | 8 | 106 | — | 0.08 | — | E |
| Comparative Example 2B | Residue | 76 | 2 | 513 | 146.6 | — | 3.50 | — | E |
| Comparative Example 3B | Residue | 148 | 9 | 513 | 80.6 | — | 6.37 | — | E |

Based on the results shown in Table 3, it was clarified that, according to the polishing liquids of the examples, defects were less likely to be generated on a polishing target surface, and a polishing speed for SiN and a polishing speed for $SiO_2$ were both high.

Furthermore, based on comparison between Example 1B and Example 4B, it was confirmed that defects on a polishing target surface were further less likely to be generated in a case where a median diameter of ceria particles was small (specifically, in a case where D10 was 10 nm or less, D50 was 15 nm or less, and D90 was 20 nm or less). Example 1B corresponds to an aspect in which a stirring speed is 200 rpm during production of ceria particles, and Example 4B corresponds to an aspect in which a stirring speed is 500 to 5,000 rpm during production of ceria particles.

Furthermore, based on comparison between Examples 2B to 7B, it was confirmed that defects on a polishing target surface were further less likely to be generated in a case where a pH of the polishing liquid was 3 to 6 (preferably 3 to 4).

Furthermore, based on comparison between Example 3B and Example 13B, it was confirmed that a polishing speed for SiN and a polishing speed for $SiO_2$ were both higher and defects on a polishing target surface were further less likely to be generated in a case where a mass content ratio of cerium atoms to alkaline earth metal atoms on surfaces of the ceria particles was 5 or more.

Furthermore, based on comparison between Example 3B and Examples 15B to 18B, it was confirmed that defects were further less likely to be generated on a polishing target surface in a case where a content of alkaline earth metal atoms was 10 mass ppt to 10 mass ppb with respect to a total mass of the ceria particles. Furthermore, based on comparison between Example 3B and Example 8B to Example 18B, it was confirmed that a polishing speed for SiN and a polishing speed for $SiO_2$ were both higher and defects on a polishing target surface were further less likely to be generated in a case where a content of alkaline earth metal atoms was 10 mass ppt to 10 mass ppb with respect to a total mass of the ceria particles, and a mass content ratio of cerium atoms to alkaline earth metal atoms was 10 to 100.

Furthermore, based on comparison between Example 3B and Examples 19B to 22B, it was confirmed that a polishing speed for SiN and a polishing speed for $SiO_2$ were both higher in a case where a content of ceria particles was 2.0% by mass or more with respect to a total mass of the polishing liquid.

Furthermore, based on comparison between Example 3B and Examples 23B to 26B, it was confirmed that a polishing speed for SiN and a polishing speed for $SiO_2$ were both higher in a case where a content of the specific acid was 0.03% to 0.2% by mass with respect to a total mass of the polishing liquid.

Furthermore, based on comparison between Example 3B and Examples 27B to 30B, it was confirmed that defects were less likely to be generated on a polishing target surface in a case where a content of the cationic polymer was 0.2% to 2% by mass with respect to a total mass of the polishing liquid. Furthermore, based on comparison between Example 3B and Examples 27B to 30B, it was confirmed that defects on a polishing target surface were further less likely to be generated in a case where a ratio of a mass of the first cationic polymer (adsorbed component) to a mass of the second cationic polymer (free component) was 0.001 to 1.00.

Furthermore, based on comparison between Example 3B, and Example 53B, Example 54B, and Example 56B to Example 58B, it was confirmed that a polishing speed for SiN and a polishing speed for $SiO_2$ were both higher in a case where a weight-average molecular weight of the cationic polymer was 15,000 or more (preferably 20,000 or more), and in a case of a polymer having a side chain including quaternized nitrogen (corresponding to Example 54B).

Furthermore, based on comparison between Example 3B and Examples 59B to 61B, it was confirmed that a polishing speed for SiN and a polishing speed for $SiO_2$ were both higher in a case where the polishing liquid contained a nitrogen-containing heterocyclic ring compound or 4-pyrone.

Furthermore, based on comparison between Example 3B and Examples 62B to 65B, it was confirmed that a ratio of a polishing speed for SiN to a polishing speed for poly-Si (selection ratio (SiN/poly-Si)) was higher in a case where the polishing liquid contained an anionic surfactant. Furthermore, it was confirmed that defects on a polishing target surface were less likely to be generated.

Based on the results in Table 3, it was clarified that the polishing liquids of the comparative examples did not meet the desired requirements.

What is claimed is:

1. A polishing liquid used for chemical mechanical polishing, the polishing liquid comprising:
- ceria particles having an average aspect ratio of 1.5 or more; and
- an anionic polymer or a cationic polymer,
- wherein the pH of the polishing liquid is 3 to 8,
- the ceria particles contain alkaline earth metal atoms in at least one region of a surface thereof,
- the mass content ratio of cerium atoms to the alkaline earth metal atoms on surfaces of the ceria particles is 5 or more,
- the cationic polymer includes a first cationic polymer adsorbed on the ceria particles and a second cationic polymer not adsorbed on the ceria particles,
- the ratio of the mass of the first cationic polymer to the mass of the second cationic polymer is 0.0005 to 1.50,
- the anionic polymer includes a first anionic polymer adsorbed on the ceria particles and a second anionic polymer not adsorbed on the ceria particles, and the ratio of the mass of the first anionic polymer to the mass of the second anionic polymer is 0.001 to 1.00, and
- in a case where the polishing liquid contains the anionic polymer, the polishing liquid further comprises: an inorganic acid or an organic acid including at least one group selected from the group consisting of a carboxylic acid group, a phosphoric acid group, a phosphonic acid group, and a sulfonic acid group.

2. The polishing liquid according to claim 1, wherein the average aspect ratio of the ceria particles is 1.5 to 10.

3. The polishing liquid according to claim 1, wherein the content of alkaline earth metal atoms is 10 mass ppt to 10 mass ppb with respect to the total mass of the ceria particles.

4. The polishing liquid according to claim 1, wherein the ceria particle contains an oxide containing the alkaline earth metal atom.

5. The polishing liquid according to claim 1, wherein a median diameter D10 of the ceria particles is 10 nm or less.

6. The polishing liquid according to claim 1, wherein a median diameter D50 of the ceria particles is 15 nm or less.

7. The polishing liquid according to claim 1, wherein a median diameter D90 of the ceria particles is 20 nm or less.

8. The polishing liquid according to claim 1, further comprising one or more selected from the group consisting of a nitrogen-containing heterocyclic ring compound and 4-pyrone.

9. The polishing liquid according to claim 1, further comprising an anionic surfactant.

10. The polishing liquid according to claim 1, wherein the average primary particle size of the ceria particles is 20 nm or less.

11. The polishing liquid according to claim 1, further comprising hexametaphosphoric acid.

12. The polishing liquid according to claim 1, wherein the polishing liquid contains the cationic polymer.

13. The polishing liquid according to claim 12,
- Wherein the ratio of the mass of the first cationic polymer to the mass of the second ionic polymer is 0.001 to 1.00.

14. The polishing liquid according to claim 12, wherein the cationic polymer has a side chain including a cationic group.

15. The polishing liquid according to claim 1,
- wherein, in a case where the polishing liquid is used for polishing silicon nitride, silicon oxide, or polysilicon,
- a ratio of a polishing speed for the silicon oxide to a polishing speed for the silicon nitride is 10 to 5,000.

16. The polishing liquid according to claim 15, wherein the ratio of the polishing speed for the silicon oxide to the polishing speed for the polysilicon is 10 to 5,000.

17. The polishing liquid according to claim 1,
- wherein, in a case where the polishing liquid is used for polishing silicon nitride, silicon oxide, or polysilicon,
- a ratio of a polishing speed for the silicon nitride to a polishing speed for the silicon oxide is 0.25 to 4.0.

18. The polishing liquid according to claim 17, wherein the ratio of the polishing speed for the silicon nitride to the polishing speed for the polysilicon is 0.25 to 500.

19. A chemical mechanical polishing method comprising bringing a polishing target surface of a polishing target object into contact with a polishing pad while supplying the polishing liquid according to claim 1 to the polishing pad attached to a polishing platen, relatively moving the polishing target object and the polishing pad to polish the polishing target surface, and obtaining a polished polishing target object.

20. The chemical mechanical polishing method according to claim 19, wherein the polishing target object includes silicon nitride and silicon oxide.

21. The chemical mechanical polishing method according to claim 20, wherein the polishing target object further includes polysilicon.

22. The chemical mechanical polishing method according to claim 1, wherein at least one region of a surface of the ceria particles is coated with an alkaline earth metal salt of a polycarboxylic acid.

23. The chemical mechanical polishing method according to claim 22, wherein the ceria particles are particles produced by a production method including the following Step A1 and Step A2 or includes the following Step A3, Step A1:

dispersing a mixed liquid obtained by mixing a solvent and cerium raw materials at a stirring speed of 500 to 5,000 rpm, and thereby preparing a dispersion liquid, Step A2:

further adding polycarboxylic acid and an alkaline earth metal salt to the dispersion liquid obtained in Step A1, and thereby obtaining a dispersion liquid containing cerium atoms, and particles in which at least one region of a surface is coated with an alkaline earth metal salt of a polycarboxylic acid, Step A3:

dispersing a mixed solution containing a solvent, cerium raw materials, a polycarboxylic acid, and an alkaline earth metal salt at a stirring speed of 500 to 5,000 rpm, and thereby obtaining a dispersion liquid containing cerium atoms, and particles in which at least one region of a surface is coated with an alkaline earth metal salt of a polycarboxylic acid.

24. The chemical mechanical polishing method according to claim 1, wherein the content of the cationic polymer or the anionic polymer is 0.01 to 10% by mass with respect to the total mass of the polishing liquid.

25. The chemical mechanical polishing method according to claim 1, wherein the inorganic acid or the organic acid includes at least one acid selected from the group consisting of acetic acid, oxalic acid, malic acid, glycine, 2-pyridinecarboxylic acid, phosphoric acid, phosphonic acid, 1-hydroxyethane-1,1-diphosphonic acid, sulfuric acid, and p-toluenesulfonic acid.

26. The chemical mechanical polishing method according to claim 1, wherein the inorganic acid or the organic acid includes at least one acid selected from the group consisting of acetic acid, oxalic acid, malic acid, glycine, 2-pyridinecarboxylic acid, phosphoric acid, 1-hydroxyethane-1,1-diphosphonic acid, and p-toluenesulfonic acid.

27. The chemical mechanical polishing method according to claim 1, wherein the polishing liquid contains the anionic polymer, the anionic polymer includes at least one selected from the group consisting of polyacrylic acid and salts thereof, and copolymers containing them; polymethacrylic acid and salts thereof, and copolymers containing them; polyamic acids and salts thereof, and copolymers containing them; polymaleic acid and salts thereof, and copolymers containing them; polyitaconic acid and salts thereof, and copolymers containing them; polyfumaric acid and salts thereof, and copolymers containing them; poly(p-styrenecarboxylic acid) and salts thereof, and copolymers containing them; and polyglyoxylic acid and salts thereof, and copolymers containing them.

28. The chemical mechanical polishing method according to claim 1, wherein the polishing liquid contains the anionic polymer, and the anionic polymer includes at least one selected from the group consisting of polyacrylic acid and salts thereof, and copolymers containing them; polymethacrylic acid and salts thereof, and copolymers containing them.

29. The polishing liquid according to claim 1, further comprising at least one compound selected from the group consisting of histidine, imidazole, 4-imidazolecarboxylic acid, 5-methylbenzotriazole, 5-aminobenzotriazole, benzotriazole, 5,6-dimethylbenzotriazole, 3-amino-1,2,4-triazole, 1,2,4-triazole, 3,5-dimethylpyrazole, pyrazole, and 4-pyrone.

30. The polishing liquid according to claim 9, wherein the anionic surfactant includes at least one selected from carboxylic acid salts, sulfonic acid salts such as alkylbenzene sulfonic acid, sulfuric acid ester salts, and phosphoric acid ester salts.

31. A polishing liquid used for chemical mechanical polishing, the polishing liquid comprising:

ceria particles having an average aspect ratio of 1.5 or more; and a cationic polymer, wherein the pH of the polishing liquid is 3 to 8, the cationic polymer includes a first cationic polymer adsorbed on the ceria particles and a second cationic polymer not adsorbed on the ceria particles, and the ratio of the mass of the first cationic polymer to the mass of the second cationic polymer is 0.0005 to 1.50.

32. The polishing liquid according to claim 31, further comprising at least one compound selected from the group consisting of histidine, imidazole, 4-imidazolecarboxylic acid, 5-methylbenzotriazole, 5-aminobenzotriazole, benzotriazole, 5,6-dimethylbenzotriazole, 3-amino-1,2,4-triazole, 1,2,4-triazole, 3,5-dimethylpyrazole, pyrazole, and 4-pyrone.

33. The polishing liquid according to claim 31, further comprising an anionic surfactant, and wherein the anionic surfactant includes at least one selected from carboxylic acid salts, sulfonic acid salts such as alkylbenzene sulfonic acid, sulfuric acid ester salts, and phosphoric acid ester salts.

* * * * *